United States Patent
Wen et al.

(10) Patent No.: US 11,879,924 B2
(45) Date of Patent: Jan. 23, 2024

(54) SYSTEM AND METHOD FOR PERFORMING MEASUREMENTS OF ANTENNA UNDER TEST OFFSET FROM CENTER OF QUIET ZONE

(71) Applicant: Keysight Technologies, Inc., Santa Rosa, CA (US)

(72) Inventors: Zhu Wen, Beijing (CN); Ya Jing, Beijing (CN); Li Cao, Beijing (CN); Thorsten Hertel, San Jose, CA (US)

(73) Assignee: KEYSIGHT TECHNOLOGIES, INC., Santa Rosa, CA (US)

( * ) Notice: Subject to any disclaimer, the term of this patent is extended or adjusted under 35 U.S.C. 154(b) by 0 days.

(21) Appl. No.: 17/059,572

(22) PCT Filed: Oct. 22, 2020

(86) PCT No.: PCT/CN2020/122906
§ 371 (c)(1),
(2) Date: Nov. 30, 2020

(87) PCT Pub. No.: WO2022/082634
PCT Pub. Date: Apr. 28, 2022

(65) Prior Publication Data
US 2023/0258703 A1    Aug. 17, 2023

(51) Int. Cl.
*G01R 29/08* (2006.01)
*G01R 29/10* (2006.01)

(52) U.S. Cl.
CPC ..... *G01R 29/0892* (2013.01); *G01R 29/0814* (2013.01); *G01R 29/105* (2013.01)

(58) Field of Classification Search
CPC .... G01R 29/00; G01R 29/08; G01R 29/0807; G01R 29/0814; G01R 29/0864; G01R 29/0892; G01R 29/10; G01R 29/105
(Continued)

(56) References Cited

U.S. PATENT DOCUMENTS 10,707,976 B1   7/2020   Derat
10,768,216 B2   9/2020   Abadie et al.
(Continued)

FOREIGN PATENT DOCUMENTS

CN    103344847 A    10/2013
CN    106443210 A  *  2/2017    ............. G01R 29/10
(Continued)

OTHER PUBLICATIONS

Notice of Allowance dated Sep. 29, 2021 for U.S. Appl. No. 17/107,169, 9 pgs.
(Continued)

*Primary Examiner* — Hoai-An D. Nguyen

(57) ABSTRACT

A system and method are provided to determine at least one of equivalent isotropic radiated power (EIRP) or effective isotropic sensitivity (EIS) of an antenna under test (AUT) in a test chamber, the AUT including an antenna array with an array phase center that is offset from a center of a quiet zone of the test chamber. The method includes performing a local beam peak direction scan of an antenna pattern of the AUT using a probe antenna located at laterally offset positions at a near-field distance from the AUT to determine a beam peak direction; performing EIRP and/or EIS near-field measurements of the AUT in the determined beam peak direction using the probe antenna located at near-field distances from the AUT in a radial direction; deriving a far-field equivalent of the EIRP and/or EIS near-field measurement along the determined beam peak direction; and deriving the beam peak direction of the AUT.

18 Claims, 15 Drawing Sheets

(58) Field of Classification Search
USPC ........................................ 324/600, 629, 637
See application file for complete search history.

(56) References Cited

U.S. PATENT DOCUMENTS

| | | | |
|---|---|---|---|
| 11,057,119 | B2 | 7/2021 | Jing et al. |
| 11,057,120 | B2 | 7/2021 | Jing et al. |
| 11,108,475 | B2 * | 8/2021 | Chapman ............. H04B 7/0617 |
| 2018/0109335 | A1 | 4/2018 | Rowell et al. |
| 2019/0335346 | A1 | 10/2019 | Abadie et al. |
| 2019/0349863 | A1 | 11/2019 | Lim et al. |
| 2020/0007245 | A1 | 1/2020 | Abadie et al. |
| 2020/0021370 | A1 | 1/2020 | Hyunh et al. |
| 2020/0088775 | A1 | 3/2020 | Anton et al. |
| 2020/0119443 | A1 | 4/2020 | Leather et al. |
| 2020/0158768 | A1 | 5/2020 | Derat et al. |
| 2020/0314765 | A1 | 10/2020 | Jung et al. |
| 2020/0358538 | A1 | 11/2020 | Olgaard et al. |

FOREIGN PATENT DOCUMENTS

| | | | | |
|---|---|---|---|---|
| CN | 107255756 | A | | 10/2017 |
| CN | 206573643 | U * | 10/2017 | ............. G01R 29/10 |
| CN | 108923863 | A * | 11/2018 | ........... H04B 17/102 |
| CN | 110133386 | A | | 8/2019 |
| CN | 111371513 | A * | 7/2020 | ............. G01R 29/10 |
| EP | 3094020 | A1 * | 11/2016 | ........... H04B 17/101 |
| WO | 03/019722 | A1 | | 3/2003 |

OTHER PUBLICATIONS

Corrected Notice of Allowability dated Oct. 4, 2021, or U.S. Appl. No. 17/107,169, 2 pgs.

"On Test methodology for high DL power and low UL power test cases," 3GPP TSG-RAN WG4 Meeting # 96-e, R4-2011218, Electronic Meeting, Aug. 17-Aug. 28, 2020, pp. 1-23.

G. F. Hamberger, J.-A. Antón, S. J. Lachner and B. Derat, "Correction of Over-the-Air Transmit and Receive Wireless Device Performance Errors Due to Displaced Antenna Positions in the Measurement Coordinate System," in IEEE Transactions on Antennas and Propagation, vol. 68, No. 11, pp. 7549-7554, Nov. 2020.

3GPP RP-192322, "Study on enhanced test methods for FR2 UEs", Sep. 16-20, 2019, 5 pgs.

Notice of Allowance dated Aug. 12, 2021, U.S. Appl. No. 17/107,169, 6 pgs.

International Search Report and Written Opinion dated Jul. 14, 2021, 9 pgs.

Notice of Allowance dated Jul. 19, 2021, for U.S. Appl. No. 17/059,572, 14 pgs.

* cited by examiner

SYSTEM AND METHOD FOR PERFORMING MEASUREMENTS OF ANTENNA UNDER TEST OFFSET FROM CENTER OF QUIET ZONE

The present application is the U.S. National Stage Application under 35 U.S.C. § 371 of, and claims priority under 35 U.S.C. § 121 from, International Patent Application No. PCT/CN2020/122906, filed on Oct. 22, 2020. The entire disclosure of International Patent Application No. PCT/CN2020/122906 is specifically incorporated herein by reference in its entirety.

BACKGROUND

Background

In testing wireless communication devices, a device under test (DUT) may have multiple antennas under test (AUTs), such as multiple antenna arrays, located at different positions on the DUT. For example, the DUT may have a first AUT for sending uplink (UL) transmissions for radio frequency (RF) signals, and a second AUT for receiving downlink (DL) transmissions of RF signals. Alternatively, the DUT might have multiple UL/DL antennas for multiple-input and multiple-output (MIMO) or diversity. Alternatively, the DUT may have multiple UL/DL antennas for MIMO or diversity. The DUT may be tested in a test chamber using white box testing or black box testing for performing measurements in the radiative near-field or far-field. In white box testing, the array center of each antenna array being tested is aligned with the center of a quiet zone in the test chamber and the offset of the array center of each antenna array is known. Black box testing, on the other hand, requires no prior knowledge of which antenna array is active or the detailed location of the active antenna array within the DUT relative to the quiet zone center of the test chamber. For example, the geometric center of the DUT may be aligned with the quiet zone center, in which case the AUTs themselves are offset from the quiet zone center by unknown amounts. For direct near-field and far-field test chambers, the black box testing can have a significant impact on measurements based on UL or DL power due to the unknown offset of the active antenna array from the center of the quiet zone. This offset can result in significant path loss differences and therefore result in significant differences for power-based metrics. Performing various measurements of the DUT is more difficult when the AUT is offset from the center of the quiet zone, particularly when the offset is by an unknown distance, thus requiring black box testing.

The AUT is offset from the quiet zone center, for example, when the array center of an antenna array of the AUT does not coincide with the quiet zone center of the quiet zone in the test chamber. Stated differently, the phase center of the AUT antenna array does not coincide with the rotation center of the test chamber. Types of measurements adversely affected by the AUT offset include total radiated power (TRP), total isotropic sensitivity (TIS), equivalent isotropic radiated power (EIRP), and effective isotropic sensitivity (EIS).

EIRP and EIS of the DUT are mandatory OTA parameters for RF performance matrices to be measured, as required by standards such as 3GPP TS38.104 for base stations and 3GPP TS38.101 for user equipment, for example. Conventional solutions for the EIRP and EIS measurements include measuring in the far-field, either by direct far-field (DFF) measurements or indirect far-field (IFF) measurements, or performing three-dimensional (3D) scanning in the near-field to get both amplitude and phase pattern, then applying the near-field scanning results to the far-field using a near-field to far-field transform algorithm.

Generally, an offset of the AUT is not an issue for far-field measurements since the offset distance of the AUT is relatively small compared to the far-field measurement distance. However, there are a number of drawbacks to performing far-field measurements. For measurement solutions based on the DFF measurements, for example, 5G base stations and user equipment utilize large antenna arrays to support massive MIMO functionality. This requires very large measurement distances for the far-field OTA measurements, and thus very large anechoic chambers for performing the OTA measurements. Such large anechoic chambers are expensive to setup, and may challenge space requirements, as a practical matter. Further, the larger far-field measurement distances result in larger propagation losses, which are another challenge to accurate OTA measurements, especially for high downlink power and low uplink power test cases. So, near-field measurements may be more desirable given the smaller measurement distance and the smaller propagation losses.

For example, 3D scanning measurements in the near-field are performed around the DUT at very close distances in order to measure 3D amplitude and phase pattern. A near-field to far-field transformation is then performed on the measured near-field data to compute the radiated power in the far-field. However, the 3D scanning measurements are very time consuming, especially when only the EIRP and EIS at the beam peak direction are needed. It is also uncertain whether the near-field to far-field transform can be used for accurate EIS measurements.

Also, conventional far-field test chambers for millimeter-wave testing have significant path losses (e.g., in excess of about 60 dB), which result in some conformance test requirements for 3rd Generation Partnership Project (3GPP) being untestable. Performing measurements in the near-field, though, would allow improvement of the relaxation due to improved path losses (e.g., about 13 dB). However, conventional measurement techniques do not account for compensating the offset of an AUT from the center of the quiet zone for near-field measurements.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

FIG. 10 FIG. 10C is a polar radiation plot showing compensation curves corresponding to the multiple near-field distances, according to a representative embodiment.

DETAILED DESCRIPTION

Figure 1:
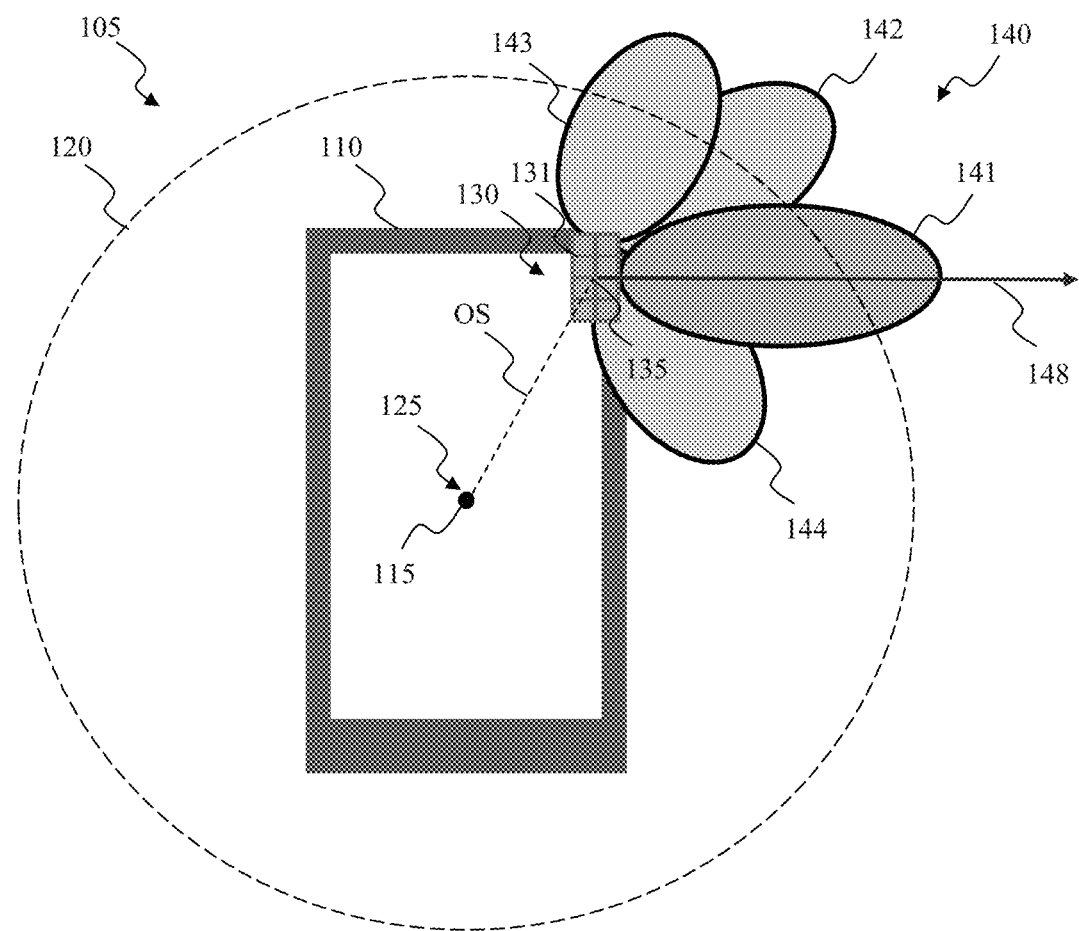
FIG. 1 is a simplified block diagram of a device under test (DUT) having an antenna under test (AUT) offset from a quiet zone center of a test chamber.

In the following detailed description, for purposes of explanation and not limitation, representative embodiments disclosing specific details are set forth in order to provide a thorough understanding of an embodiment according to the present teachings. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing particular embodiments only and is not intended to be limiting. The defined terms are in addition to the technical and scientific meanings of the defined terms as commonly understood and accepted in the technical field of the present teachings.

It will be understood that, although the terms first, second, third etc. may be used herein to describe various elements or components, these elements or components should not be limited by these terms. These terms are only used to distinguish one element or component from another element or component. Thus, a first element or component discussed below could be termed a second element or component without departing from the teachings of the present disclosure.

The terminology used herein is for purposes of describing particular embodiments only and is not intended to be limiting. As used in the specification and appended claims, the singular forms of terms "a," "an" and "the" are intended to include both singular and plural forms, unless the context clearly dictates otherwise. Additionally, the terms "comprises," and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

Unless otherwise noted, when an element or component is said to be "connected to," "coupled to," or "adjacent to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components.

The present disclosure, through one or more of its various aspects, embodiments and/or specific features or sub-components, is thus intended to bring out one or more of the advantages as specifically noted below. For purposes of explanation and not limitation, example embodiments disclosing specific details are set forth in order to provide a thorough understanding of an embodiment according to the present teachings. However, other embodiments consistent with the present disclosure that depart from specific details disclosed herein remain within the scope of the appended claims. Moreover, descriptions of well-known apparatuses and methods may be omitted so as to not obscure the description of the example embodiments. Such methods and apparatuses are within the scope of the present disclosure.

Generally, according to various embodiments, signal measurements of a device under test (DUT), such as equivalent isotropic radiated power (EIRP), effective isotropic sensitivity (EIS), and signal quality including error vector magnitude (EVM), are performed in a test chamber, where the DUT has at least one antenna under test (AUT) that is offset from a center of a quiet zone of the near-field test chamber. Also, the AUT may have beam-forming capability.

FIG. 1 is a simplified block diagram of a DUT having an AUT offset from a quiet zone center of a test chamber, according to a representative embodiment.

Referring to FIG. 1, a DUT 110 is positioned in a quiet zone 120 of a test chamber 105. The geometric center 115 of the DUT 110 is aligned with a quiet zone center 125 of the quiet zone 120. The DUT 110 includes a representative AUT 130, which is located on an outside edge of the DUT 110, away from the geometric center 115. The AUT 130 has beamforming capability. In the depicted embodiment, the AUT 130 includes an antenna array 131 having antenna pattern 140. For purposes of illustration, and not limitation, the antenna array 131 includes eight antenna elements arranged in a 2×4 array, and has an array phase center 135 at the physical and/or electronic center of the 2×4 array. The array phase center 135 is offset from the quiet zone center 125 by an offset OS at an angle and distance from the quiet zone center 125 to the array phase center 135 of the antenna array 131 at an offset location. The amount of the offset may be known or unknown, depending on the embodiment described herein. Accordingly, measurements of the AUT 130, such as EIRP, EIS and/or EVM, for example, are performed according to black box testing. Of course, the antenna array 131 may include more or fewer antenna elements arranged in various patterns, without departing from the scope of the present teachings. Also, the AUT 130 may be an uplink or downlink antenna.

Each antenna element of the antenna array 131 has a large number of codebooks, resulting in the antenna pattern 140 having different beams, indicated by representative first beam 141, second beam 142, third beam 143 and fourth beam 144. For conformance testing, for example, only the beam with the best performance needs to be evaluated. The best beam is typically the beam with the best EIRP or EIS performance or best signal quality in the declared test direction in the far-field, for example. Each of the first through fourth beams 141-144 has a corresponding beam peak direction from the array phase center 135. The beam peak direction 148 of the first beam 141 is shown by an arrow that extends substantially perpendicularly to the antenna array 131 in the depicted example.

Figure 2:
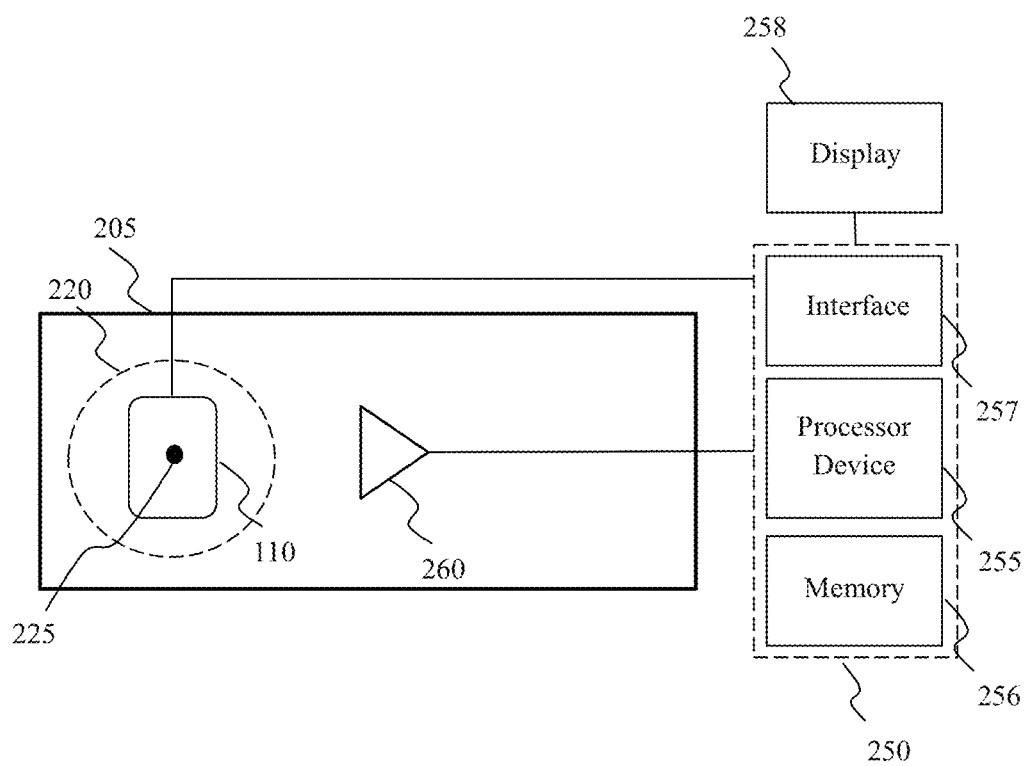
FIG. 2 is a simplified block diagram showing a test system for determining one or more of EIRP, EIS, TRP or TIS of a DUT including at least one AUT that is offset from a quiet zone center, according to a representative embodiment.

FIG. 2 is a simplified block diagram showing a test system for determining one or more of EIRP, EIS or EVM of a DUT including at least one AUT that is offset from a quiet zone center, according to a representative embodiment.

Referring to FIG. 2, a system 200 includes a test chamber 205 and a processing unit 250 in communication with the test chamber 205. The test chamber 205 may be an anechoic chamber, for example. The DUT 110 is located in a quiet zone (not shown) of the test chamber 205, and includes the AUT 130 offset from the center of the quiet zone, as discussed above. In the depicted example, the test chamber 205 includes at least one near-field probe antenna, indicated by a near-field probe antenna 260. The test chamber 205 may also include a far-field probe antenna (not shown) to introduce a far-field environment at the DUT 110, for instance a conventional probe antenna placed in the far-field or a compact antenna test range reflector-based methodology. The probe antenna 260 may be movable to different locations within test chamber 205, in both lateral and radial directions relative to the DUT 110, and may have varying range lengths. In an embodiment, the test chamber 205 may be a near-field test chamber or a far-field test chamber with at least one near-field probe antenna located in the near-field, without departing from the scope of the present teachings.

The processing unit 250 includes a processor device 255, memory 256, and an interface 257, together with a display 258. The processor device 255, together with the memory 256, implements the methods of determining at least one of the TRP, the EIRP and the EIS of the DUT 110 in the test chamber 205, and may be configured to perform and/or control all or a portion of the steps of the processes shown in FIGS. 4 and 8, discussed below. In various embodiments, the processor device 255 may include a general purpose computer, a central processing unit (CPU), one or more processors, microprocessors or microcontrollers, a state machine, a programmable logic device, field programmable gate arrays (FPGAs), application specific integrated circuits (ASICs), or combinations thereof, using any combination of hardware, software, firmware, hard-wired logic circuits, or combinations thereof. The term "processor," in particular, encompasses an electronic component able to execute a program or machine executable instructions. References to a processor should be interpreted to include more than one processor or processing core, as in a multi-core processor, and/or parallel processors. A processor may also refer to a collection of processors within a single computer system or distributed among multiple computer systems, such as in a cloud-based or other multi-site application. Programs have software instructions performed by one or multiple processors that may be within the same computing device or which may be distributed across multiple computing devices. The processor device 255 may have its own memory (not shown), and is in communication with the memory 256.

The memory 256 stores instructions/computer readable code (e.g., software, software modules) that enables performance of the various functions described herein. For example, the memory 256 may store software instructions/computer readable code executable by the processor device 255 (e.g., computer processor) for performing some or all aspects of methods described herein. The memory 256 may be implemented by any number, type and combination of random access memory (RAM) and read-only memory (ROM), for example, and may store various types of information, such as software algorithms, AI models including ANN and other neural network based models, and computer programs, all of which are executable by the processor device 255. The various types of ROM and RAM may include any number, type and combination of computer readable storage media, such as a disk drive, flash memory, an electrically programmable read-only memory (EPROM), an electrically erasable and programmable read only memory (EEPROM), registers, a hard disk, a removable disk, tape, compact disk read only memory (CD-ROM), digital versatile disk (DVD), floppy disk, blu-ray disk, a universal serial bus (USB) drive, or any other form of storage medium known in the art. The memory 256 may be secure and/or encrypted, or unsecure and/or unencrypted. The memory 256 is representative of one or more memories and databases, including the processing memory, as well as multiple memories and databases, including distributed and networked memories and databases.

The memory 256 is a tangible storage medium for storing data and executable software instructions, and is non-transitory during the time software instructions are stored therein. As used herein, the term "non-transitory" is to be interpreted not as an eternal characteristic of a state, but as a characteristic of a state that will last for a period. The term "non-transitory" specifically disavows fleeting characteristics such as characteristics of a carrier wave or signal or other forms that exist only transitorily in any place at any time. The memory 256 may store software instructions and/or computer readable code that enable performance of various functions. The terms "memory" and "database" are examples of computer-readable storage media, and should be interpreted as possibly being multiple memories or databases. The memory or database may for instance be multiple memories or databases local to the computer, and/or distributed amongst multiple computer systems or computing devices.

The interface 257 may include a user interface and/or a network interface for providing information and data output by the processor device 255 and/or the memory 256 to the user and/or for receiving information and data input by the user. That is, the interface 257 enables the user to enter data and to control or manipulate aspects of the process determining the EIRP and/or EIS of the DUT, and also enables the processor device 255 to indicate the effects of the user's control or manipulation (e.g., on the display 258). The interface 257 may include one or more of ports, disk drives, wireless antennas, or other types of receiver circuitry. The interface 257 may further connect one or more user interfaces, such as a mouse, a keyboard, a mouse, a trackball, a joystick, a microphone, a video camera, a touchpad, a touchscreen, voice or gesture recognition captured by a microphone or video camera, for example, or any other peripheral or control to permit user feedback from and interaction with the processing unit 250.

The display 258 may be a monitor such as a computer monitor, a television, a liquid crystal display (LCD), an organic light emitting diode (OLED), a flat panel display, a solid-state display, or a cathode ray tube (CRT) display, or an electronic whiteboard, for example. The display 258 may also provide a graphical user interface (GUI) for displaying and receiving information to and from the user. The interface 257 may include a user and/or network interface for providing information and data output by the processor device 255 and/or the memory 256 to the user and/or for receiving information and data input by the user. That is, the interface 257 enables the user to enter data and to control or manipulate aspects of the processes described herein, and also enables the processor device 255 to indicate the effects of the user's control or manipulation. The interface 257 may connect one or more user interfaces, such as a mouse, a keyboard, a mouse, a trackball, a joystick, a haptic device, a microphone, a video camera, a touchpad, a touchscreen, voice or gesture recognition captured by a microphone or video camera, for example.

Generally, a method of determining at least one operating parameter of a DUT in a test chamber, where the DUT has at least one AUT that has beam-forming capability and is offset from a center of a quiet zone of the test chamber, using a black box approach may include establishing an over-the-air (OTA) connection with the DUT using a far-field probe antenna in the OTA test chamber so that the at least one AUT forms a beam in the desired direction towards the far-field probe antenna; locking the beam of the at least one AUT in the desired direction to prevent subsequent beam forming; and performing a near-field measurement of the at least one AUT with the beam locked in the desired direction using a near-field probe antenna in the OTA test chamber.

Figure 3A:
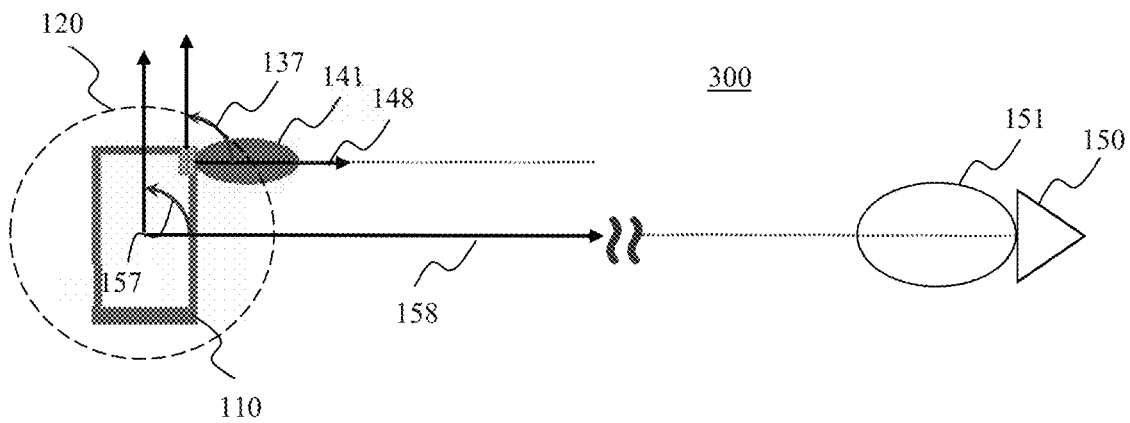
FIG. 3A is a simplified block diagram of a DUT having an AUT offset from a quiet zone center of a test chamber with a probe antenna in the far-field, according to a representative embodiment.

FIG. 3A is a simplified block diagram of a DUT having an AUT offset from a quiet zone center of a far-field test chamber with a probe antenna in the far-field, according to a representative embodiment.

Referring to FIG. 3A, a system 300 for performing measurements of the DUT 110 includes test chamber 106 and a representative probe antenna 150 that introduces a far-field environment at the DUT 110, for instance a conventional probe antenna placed in the far-field or a compact antenna test range reflector-based methodology. The probe antenna 150 has a corresponding probe antenna pattern 151. As discussed above, the DUT 110 is positioned in the quiet zone 120 of the test chamber 106, and includes the AUT 130 having antenna array 131 with the array phase center 135 offset from the quiet zone center 125 of the quiet zone 120.

Since the probe antenna 150 is located in the far-field, the best beam for performing the power measurements is the first beam 141, in the depicted example. Also, due to the relatively large distance separating the DUT 110 and the probe antenna 150 in the far-field, the offset of the AUT 130 does not affect the measurements and beam steering in the beam peak direction 148 of the first beam 141. That is, the beam peak direction 148 toward the probe antenna 150 relative to the offset antenna array 131 and relative to the quiet zone center 125 of quiet zone 120 are substantially aligned, as a practical matter. This is indicated by a measurement angle 137 being equal to a probe antenna angle 157, where the measurement angle 137 is the angle between the beam peak direction 148 and a first reference line extending from the array phase center 135 in a longitudinal direction (vertical direction, in the depicted orientation) of the antenna array 131, and the probe antenna angle 157 is the angle between a probe antenna direction 158 from the quiet zone center 125 toward the probe antenna 150 and a second reference line extending from the quiet zone center 125 parallel to the first reference line. In the depicted example, each of the measurement angle 137 and the probe antenna angle 157 is 90 degrees. Therefore, the beam peak direction 148 accurately captures the direction from each of the array phase center 135 and the quiet zone center 125 toward the probe antenna 150. The far-field and near-field distances are functions of physical dimensions of the antenna array 131, as would be apparent to one skilled in the art.

As discussed above, it is desirable to perform the power measurements in the near-field relative to the DUT 110, due in part to the significantly improved power loss characteristics when performing measurements in the near-field as compared to the far-field. It is further desirable to perform the measurements on the same beam (e.g., first beam 141) of the antenna pattern 140 in the near-field as in the far-field. This may be accomplished using a probe antenna positioned in the near-field of the DUT 110. However, due to the close proximity of the AUT 130 and the probe antenna 150 in the near-field, the offset of the AUT 130 from the quiet zone center 125 necessarily affects selection of the best beam using the antenna beamforming capability for performing the power measurements.

Therefore, according to an embodiment of the present disclosure, the first beam 141 formed by the AUT 130 is locked in the beam peak direction 148, enabling far-field power measurements. Locking the beam prevents subsequent beam forming by the AUT 130 when subsequently performing near-field measurements, so that the near-field measurements are of the same beam (the first beam 141) as established for the far-field measurements. Notably, actual far-field measurements need not be performed in in order to identify the appropriate beam peak direction. Rather, an OTA connection may be established between the AUT 130 and the far-field probe antenna 150 so that the AUT 130 forms and locks the first beam 141 in the beam peak direction 148.

Figure 3B:
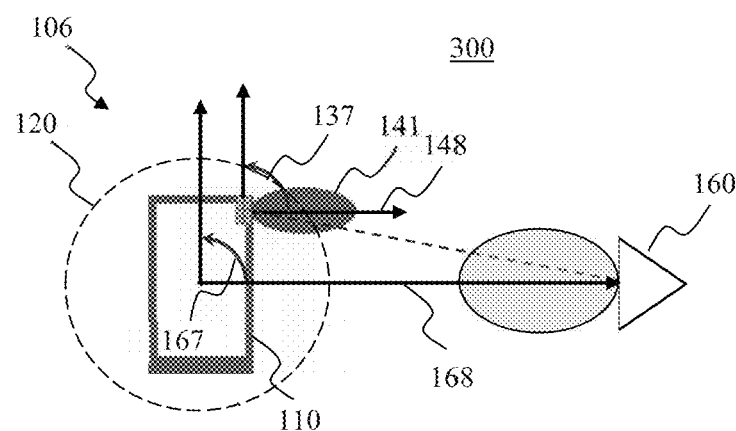
FIG. 3B is a simplified block diagram of a DUT having an offset AUT with locked beamforming.
Figure 3C:
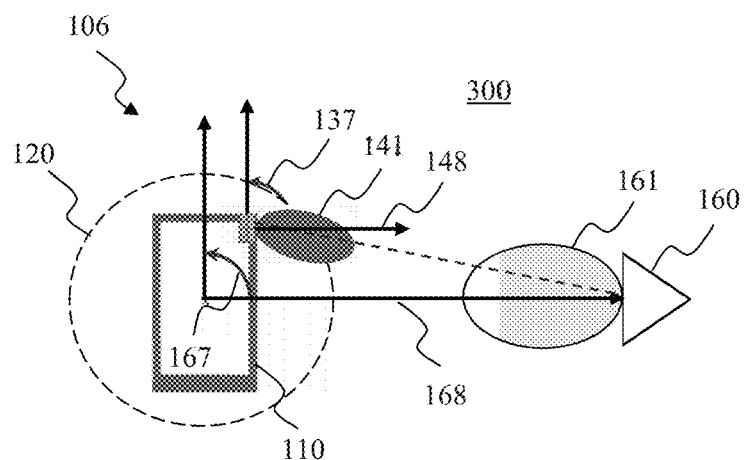
FIG. 3C is a simplified block diagram of a DUT having an offset AUT with active beamforming and the probe antenna positioned improperly.
Figure 3D:
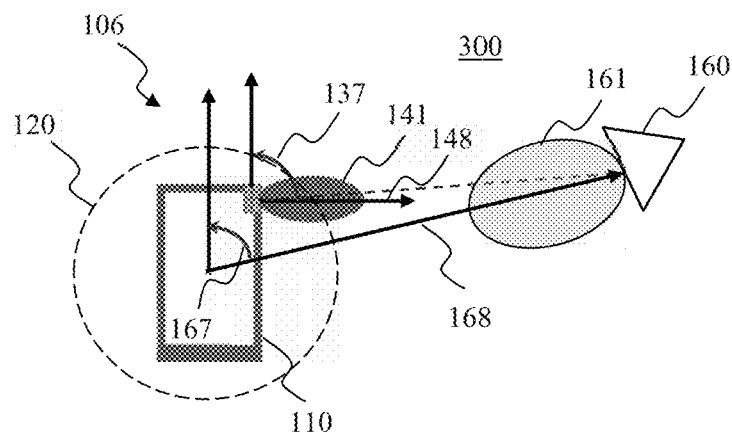
FIG. 3D is a simplified block diagram of a DUT having an offset AUT with locked beamforming and the probe antenna positioned properly, according to a representative embodiment.

FIGS. 3B, 3C and 3D show the effects of performing near-field measurements in the near-field by an offset AUT with beamforming and without beamforming (e.g., beam lock). In particular, FIG. 3B is a simplified block diagram of a DUT having an offset AUT with locked beamforming (or no beamforming) and the probe antenna positioned improperly, FIG. 3C is a simplified block diagram of a DUT having an offset AUT with active beamforming, and FIG. 3D is a simplified block diagram of a DUT having an offset AUT with locked beamforming and the probe antenna positioned properly, according to a representative embodiment.

Referring to FIG. 3B, the system 300 includes the test chamber 106 and a representative probe antenna 160 located in the near-field in relation to the DUT 110. It is understood that the probe antenna 160 may be a separate probe antenna or may be the same as the probe antenna 150, but located in the near-field. The probe antenna 160 has a corresponding probe antenna pattern 161. The DUT 110 is positioned in the quiet zone 120 of the test chamber 106, and includes the AUT 130 having the antenna array 131 with the array phase center 135 offset from the quiet zone center 125.

The beam of the AUT 130 has been locked in the beam peak direction 148. Meanwhile, the probe antenna 160 is positioned in the near-field in a probe antenna direction 168 from the quiet zone center 125 toward the probe antenna 160 at the same angle from the quiet zone center 125 as the probe antenna 150 in FIG. 3A. That is, the probe antenna angle 167 in FIG. 3B is equal to the probe antenna angle 157 in FIG. 2. However, because the probe antenna 160 is at the same angle from the quiet zone center 125 as the probe antenna 150, and the AUT is locked in the beam peak direction 148 determined for far-field measurements, the signal path between the AUT 130 and the probe antenna 160 is not transmitted along the respective beam peaks, which increases system losses and thus the uncertainty to properly estimate power measurements. The direction of transmission is indicated by the dashed line between the array phase center 135 and the probe antenna 160, shown exiting the first beam 141 in a direction other than the beam peak direction 148.

Referring to FIG. 3C, the system 300' includes the test chamber 106 and the representative probe antenna 160 at the same probe antenna angle 167 from the quiet zone center 125. The beam of the AUT 130 has not been locked in the beam peak direction 148. Since the AUT 130 has active beamforming, a beam other than the first beam 141 of the antenna pattern 140 is formed having a beam peak direction toward the probe antenna 160, indicated by the dashed line. For example, the beam may be the fourth beam 144 shown in FIG. 1. This beam peak direction provides the strongest signals for the power measurements, although the beam itself is different from the first beam 141 for the far-field power measurements. The consequence of this scenario is that the system 200 would evaluate a different, unintended antenna beam with potentially completely measurement results in the near-field as compared to the far-field.

Referring to FIG. 3D, the system 300' includes the test chamber 106 and the representative probe antenna 160, which is located in the locked desired beam peak direction 148 of the AUT 130. The probe antenna 160 has been located in the beam peak direction 148, providing the strongest signal between the AUT 130 and the probe antenna 160. In this case, the probe antenna angle 167 is less than the measurement angle 137, such that the probe antenna direction 168 converges with the beam peak direction 148. Also, the EIRP, EIS and/or EVM measurements of the signal between the AUT 130 and the probe antenna 160 in the near-field are the most representative of corresponding derived EIRP, EIS and/or EVM in the far-field since the same beam (first beam 141) is used in both scenarios. The position of the probe antenna 160 and/or the probe antenna angle 167 may be determined using a local beam peak direction scan, for example.

Figure 4:
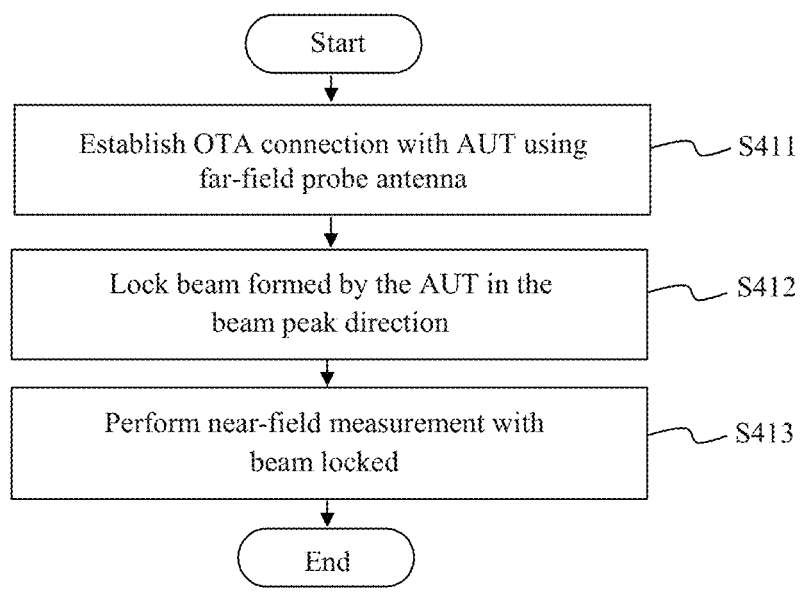
FIG. 4 is a simplified block diagram showing a test system for performing near-field and far-field measurements of a DUT including at least one AUT with beam-forming capability, according to a representative embodiment.

FIG. 4 is a simplified flow diagram illustrating a method of performing near-field and far-field measurements of a DUT in a test chamber, according to a representative embodiment. As discussed above, the DUT has at least one AUT that has beam-forming capability. The AUT includes an antenna array that has an array center that is offset from a center of a quiet zone of the near-field test chamber by an unknown offset. For example, the geometric center of the DUT may be aligned with the center of the quiet zone, while one or more AUTs are positioned at outer portions of the DUT, offset from the center of the quiet zone. Therefore, the method shown in FIG. 4 depicts black box testing. The method may be implemented by the processing unit 250, for example, where the method steps are provided as instructions stored in the memory 256 and executable by the processor device 255.

Referring to FIG. 4, the method includes establishing an OTA signaling connection with the DUT (e.g., DUT 110) using a far-field probe antenna (e.g., probe antenna 150) in the test chamber (e.g., test chamber 405) in block S411. The OTA connection may be uplink and downlink connection. Since the AUT is steerable, it automatically forms a beam in a beam peak direction towards the far-field probe antenna during the beam forming process. That is, the beam formed in the beam peak direction is a best performance beam of multiple beams formed by the AUT. The far-field distance between the AUT and the far-field probe antenna is large enough such that there is no effect of the center of the antenna array being offset from the center of the quiet zone with regard to the beam forming and power measurements; alternatively, the far-field environment can be established using an indirect far-field approach, for instance using a compact antenna test range.

In block S412, the beam formed by the AUT is locked in the beam peak direction to prevent subsequent beam forming. The beam may be locked in response to a control signal provided by the processor device 255 to the DUT. Locking the beam prevents the AUT from beamforming, and selecting a different beam during local searches and/or near-field measurements.

In block S413, a near-field measurement is performed of the AUT, while the beam remains locked in the beam peak direction. The near-field measurement is performed using a near-field probe antenna (e.g., probe antenna 160) in the test chamber. This includes establishing an OTA connection with the DUT using the near-field probe antenna and performing the measurement, such as EIRP, EIS and/or signal quality measurements, for example. By locking the beam in the far-field communication, the AUT is forced to select the correct beam in the near-field testing, so that the correct beam and also the correct power measurement results are obtained. This reduces measurement uncertainty of the near-field measurements.

In addition, the method may optionally include performing a far-field measurement of the AUT after establishing the OTA connection between the AUT and the far-field probe antenna in block S411 with the beam locked in the beam peak direction. The step is optional since the beam may be formed in the beam peak direction and locked without actually performing the measurement. When compared, the near-field measurement from block S413 has lower path loss than the far-field measurement, and thus a higher dynamic range.

Generally, various embodiments are directed to a lateral offset search that includes performing multiple measurements of the EIRP and/or the EIS of an AUT of a DUT at different test distances to the center of a quiet zone at a near-field distance. Based on the multiple measurements, the position of the AUT relative to the quiet zone center may be estimated without any information regarding the arrangement and/or location of the AUT on the DUT. For example, when the AUT is an antenna array, an offset location of an array phase center of the antenna array may be estimated relative to the quiet zone center. Also, the far-field EIRP and/or EIS may be determined based on the multiple measurements and estimated position of the AUT. Compared to conventional techniques, the various embodiments include a number of advantages, such as being able to support black box testing, reducing OTA test distance requirements compared to far-field methods, and providing accurate position estimations of the array phase center of an array antenna, which can be used for other OTA measurements, such as near-field corrected TRP measurements, discussed above.

Figure 5:
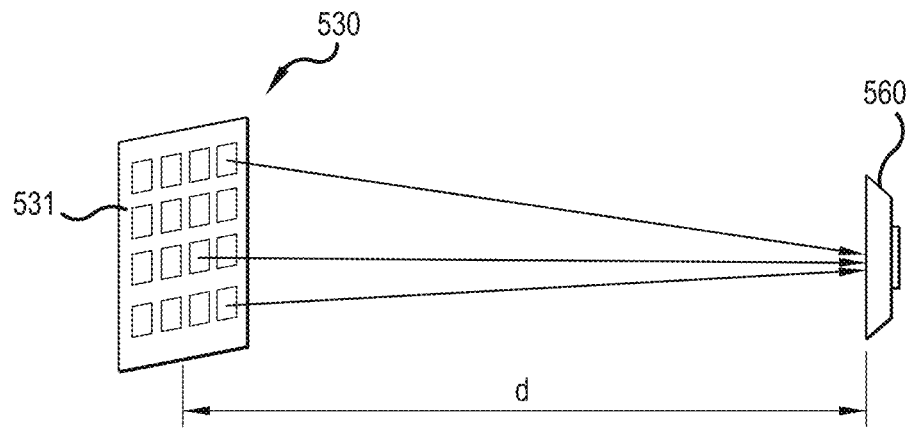
FIG. 5 is a schematic diagram of a DUT having an AUT with an array antenna.

FIG. 5 is a schematic diagram of a DUT having an AUT with an array antenna. Referring to FIG. 5, an AUT 530 includes an antenna array 531 with a representative 4×4 array of antenna elements. A probe antenna 560 is positioned such that test distance d can satisfy far-field criteria for each antenna element in the antenna array 531, but may still be in the near-field for the whole antenna array 531. Because the test distance d cannot satisfy far-field criteria for the individual antenna elements, the distance between each antenna element of the antenna array 531 cannot share the same test distance, angle of arrival (AOA) and angle of departure (AOD), as would otherwise be the case if the test distance d did satisfy the far-field criteria. Accordingly, a composited antenna pattern of the AUT 530 measured by the probe antenna 560 at the test distance d can be expressed as follows:

$$y(\vartheta, \phi, d) = \sum_{k=1}^{N} x_k G_k(\theta_k, \varphi_k) \frac{\lambda}{4\pi d_k} \exp\left(j2\pi \frac{d_k}{\lambda}\right) G_P(\vartheta_k, \phi_k)$$

In this equation, $(\vartheta, \phi, d)$ is the position of the probe antenna 560 related to the array phase center of the AUT 530, where $(\vartheta, \phi)$ is the azimuth and elevation angles, and d is the absolute distance between the AUT 530 and the probe antenna 560; k is antenna element index for the AUT 530; N is the antenna element number contributing to this beam; $x_k$ is a stimulus signal for the kth antenna element (beamforming coefficient); $G_k$ is the far-field complex antenna pattern for antenna element k; $(\theta_k, \varphi_k)$ is the azimuth and elevation angles of the kth antenna element of the AUT 530 with respect to the probe antenna 560, calculated based on probe antenna position and kth antenna element position; $\lambda$ is wavelength; $d_k$ is the distance between antenna element k of the AUT 530 to the probe antenna 560; $G_p$ is the far-field complex antenna pattern for the probe antenna 560; $(\vartheta_k, \phi_k)$ is the azimuth and elevation angles of the probe antenna 560 with respect to kth antenna element of the AUT 530, which is calculated based on probe antenna position and kth antenna element position;

$$\frac{\lambda}{4\pi d_k}$$

is path loss; and $$2\pi \frac{d_k}{\lambda}$$

is the phase variation caused by propagation on length of $d_k$.

Because the test distance d for each antenna element is already in the far-field, each antenna element's far-field pattern can still be used and the path loss can be regarded as $$\frac{\lambda}{4\pi d_k}$$

for each element in the equation. This analysis of the beam pattern can be applied to both transmit beamforming and receive beamforming. Therefore, the above equation and the present embodiments can work to derive both far-field EIRP and far-field EIS from measurements in near-field distances. Based on the above assumption, the array phase center of antenna array 531 may be located at any position of the DUT for black box testing.

Figure 6:
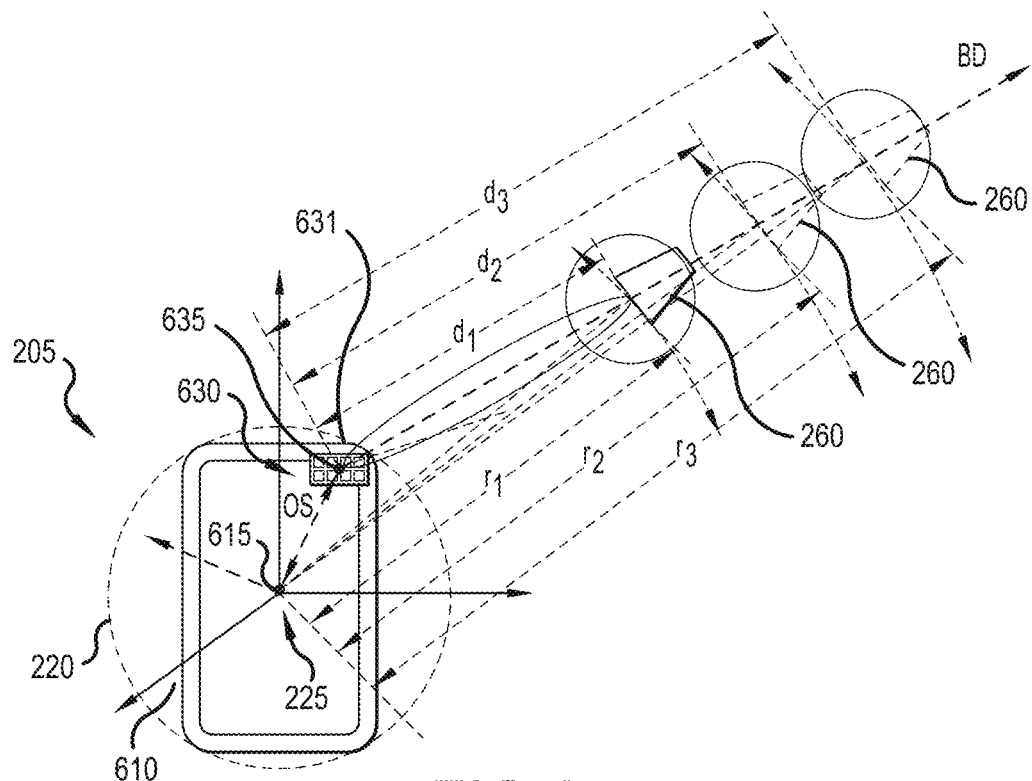
FIG. 6 is a simplified block diagram of a DUT having an AUT offset from a quiet zone center of a test chamber, indicating different distances to a probe antenna, according to a representative embodiment.

FIG. 6 is a simplified block diagram of a DUT having an AUT offset from a quiet zone center of a test chamber, indicating different distances to a probe antenna, according to a representative embodiment.

Referring to FIG. 6, a DUT 610 is positioned in the quiet zone 220 of the test chamber 205. The geometric center 615 of the DUT 610 is aligned with a quiet zone center 225 of the quiet zone 220. The DUT 610 includes an AUT 630, which is located on an outside edge of the DUT 610, for example, away from the geometric center 615. In the depicted embodiment, the AUT 630 includes an antenna array 631 having an antenna pattern with a beam peak in beam peak direction BD, indicated by a dashed arrow extending from an array phase center 635 of the antenna array 631. For purposes of illustration, and not limitation, the antenna array 631 includes eight antenna elements arranged in a 2×4 array, where the array phase center 635 is at the physical and electronic center of the 2×4 array. The array phase center 635 is offset from the quiet zone center 625 by an unknown offset OS at an angle and distance from the quiet zone center 625 to the array phase center 635 of the antenna array 631 at an offset location. Of course, the antenna array 631 may include more or fewer antenna elements arranged in various patterns, without departing from the scope of the present teachings. Also, the AUT 630 may be an uplink or downlink antenna.

The test chamber 205 further includes the probe antenna 260, which is aligned with the beam peak direction BD for communicating with the AUT 630, via uplink and/or downlink transmissions. The probe antenna 260 is shown in three different locations at three near-field measurement distances from the array phase center 635 of the antenna array 631, indicated as first near-field distance $d_1$, second near-field distance $d_2$ and third near-field distance $d_3$. The three locations of the probe antenna 260 are also at three different radii $r_1$, $r_2$ and $r_3$, respectively, from the quiet zone center 225 of the quiet zone 220. Due to the offset location of antenna array 631, the measurement distances $d_1$, $d_2$ and $d_3$ are not equal to the radii $r_1$, $r_2$ and $r_3$, respectively. Therefore, the first, second and third near-field distances $d_1$, $d_2$ and $d_3$ are unknown in the EIRP or EIS measurements, and need to be estimated.

For purposes of illustration, an example of determining the EIRP of the AUT 630 in its unknown offset location is provided. It is understood that the equations and analysis equally apply to determining the EIS of the AUT 630. The EIRP of the AUT 630 with the probe antenna 260 at an arbitrary far-field distance $d_f$ from the AUT 630 may be determined according to Equation (2):

$$EIRP(d_f) = EIRP(d_1) + \int_{d_1}^{d_f} \frac{\partial p}{\partial d} d\Delta d \quad (1)$$

In Equation (1), $EIRP(d_1)$ is the measured EIRP with the probe antenna 260 at the first near-field distance $d_1$, $\partial p/\partial d$ is the derivation of power p to distance d, and $d\Delta d$ is the differentiation of the distance d. Because the first near-field distance $d_1$ is unknown, measurements of the EIRP at multiple measurement distances are needed to derive both the derivation $\partial p/\partial d$ and the first near-field distance $d_1$.

It is known that the beam shape of the antenna pattern is different at each of the first, second and third near-field distances $d_1$, $d_2$ and $d_3$, but the beam peak direction BD remains the same. Therefore, the positions of the probe antenna 260 at the first, second and third near-field distances $d_1$, $d_2$ and $d_3$ and the array phase center 635 are aligned, as shown by the arrow indicating the beam peak direction BD.

Accordingly, the position of the array phase center 635 with the probe antenna 260 at the first near-field distance $d_1$ and the derivation of power to distance $$\frac{\partial p}{\partial d}$$

may be estimated, using Equation (2):

$$\frac{\partial p}{\partial d} = ad^{-2} + \Delta(d) \quad (23)$$

In Equation (2), d is the near-field measurement distance, a is a coefficient of expansion to be determined, and $\Delta(d)$ is a redundant term for $$\frac{\partial p}{\partial d},$$

consisting of terms having a lower order than $d^{-2}$. The term $\Delta(d)$ may be ignored in the following analysis.

Generally, performing near-field EIRP and/or EIS measurements of the AUT 630 requires determining the beam peak direction of the AUT 630, and performing EIRP and/or EIS measurements of the AUT 630 from multiple (at least three) locations of the probe antenna in the near-field. The beam peak direction may be determined using lateral beam peak searching, discussed below.

Figure 7A:
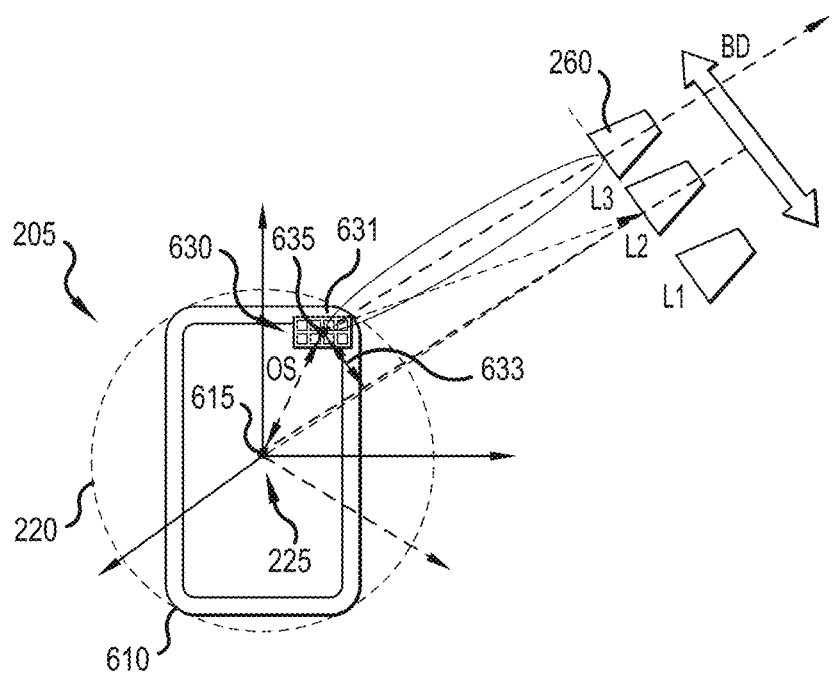
FIG. 7A is a simplified block diagram of a DUT having an AUT offset from a quiet zone center of a test chamber with a probe antenna at different lateral positions for measuring EIRP and/or EIS, according to a representative embodiment.
Figure 7B:
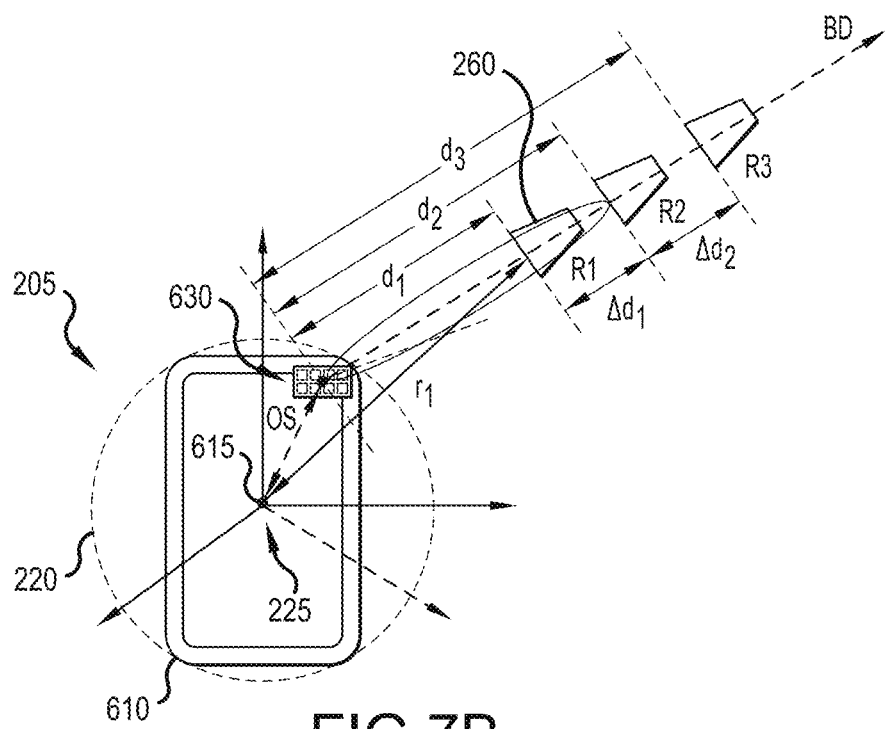
FIG. 7B is a simplified block diagram of the DUT having the AUT offset from the quiet zone center of the test chamber with the probe antenna at different distances for measuring EIRP and/or EIS, according to a representative embodiment.

FIG. 7A is a simplified block diagram of a DUT having an AUT offset from a quiet zone center of a test chamber with a probe antenna at different lateral positions for measuring EIRP and/or EIS, according to a representative embodiment. FIG. 7B is a simplified block diagram of the DUT having the AUT offset from the quiet zone center of the test chamber with the probe antenna at different distances for measuring EIRP and/or EIS, according to a representative embodiment.

Referring to FIG. 7A, the probe antenna 260 is shown positioned in three different locations laterally offset from one another, indicated by representative first lateral position L1, second lateral position L2, and third lateral position L3. The probe antenna 260 has a known probe antenna pattern. The distance between the AUT 630 and the probe antenna 260 at each of the first to third lateral positions L1-L3 is an arbitrary, fixed near-field distance. A local beam peak direction scan of the antenna pattern of the AUT 630 is performed using the probe antenna 260 located at each the first to third lateral positions L1-L3 to determine the beam peak direction BD of the AUT 630 in the near-field. In the depicted example, the beam peak direction is determined to be the direction corresponding to the probe antenna 260 being located at the third lateral positon L3. Notably, if the AUT 630 were not offset, such that the array phase center 635 aligned with the quiet zone center 225, the beam peak direction of the AUT 630 would be detected with the probe antenna 260 in the second lateral position L2. Although FIG. 7A shows the probe antenna 260 in three laterally offset positions, it is understood that the number of laterally offset positions may vary, so long as the beam peak direction BD is determined with an acceptable level of confidence.

Referring to FIG. 7B, the probe antenna 260 is shown positioned in three different locations offset from one another at different radii in a radial direction from the array phase center 635 corresponding to the beam peak direction BD. Thus, in the depicted example, the radial direction corresponds to the third position L3 in FIG. 7A. The three different radial positions are indicated by representative first radial position R1 at first near-field distance $d_1$, second radial position R2 at second near-field distance $d_2$, and third radial position R3 at third near-field distance $d_3$. The second near-field distance $d_2$ equals the first near-field distance $d_1$ plus a known first interval $\Delta d_1$, and the third near-field distance $d_3$ equals the second near-field distance $d_2$ plus a known second interval $\Delta d_2$. The first and second intervals $\Delta d_1$ and $\Delta d_2$ may be the same as or different from one another. EIRP and/or EIS near-field measurements of the AUT 630 are made in the determined beam peak direction BD using the probe antenna 260 located at each of the first to third radial positions R1-R3. FIG. 7B shows the probe antenna 260 in three radially offset positions, which is the minimum number needed in the depicted embodiment in order solve Equations (1) and (2) for a minimum of three unknowns, as discussed below. It is understood, though, that measurements may be made at more than three radially offset positions, without departing from the scope of the present teachings.

A far-field equivalent of the EIRP and/or EIS near-field measurements is derived along the determined beam peak direction BD using the EIRP and/or EIS near-field measurements. Also, the beam peak direction of the AUT 630 is derived for the far-field using the locally measured beam peak direction BD, where the beam peak direction BD in the far-field is the same as the beam direction BD in near-field, as determined in the lateral beam peak searching. Also, the offset location of the array phase center 635 of the antenna array 631 may be determined based on the beam peak direction BD determined by the local beam peak direction scan and the EIRP and/or EIS near-field measurements of the AUT 630 in the determined beam peak direction BD, discussed below with reference to FIG. 8.

Figure 8:
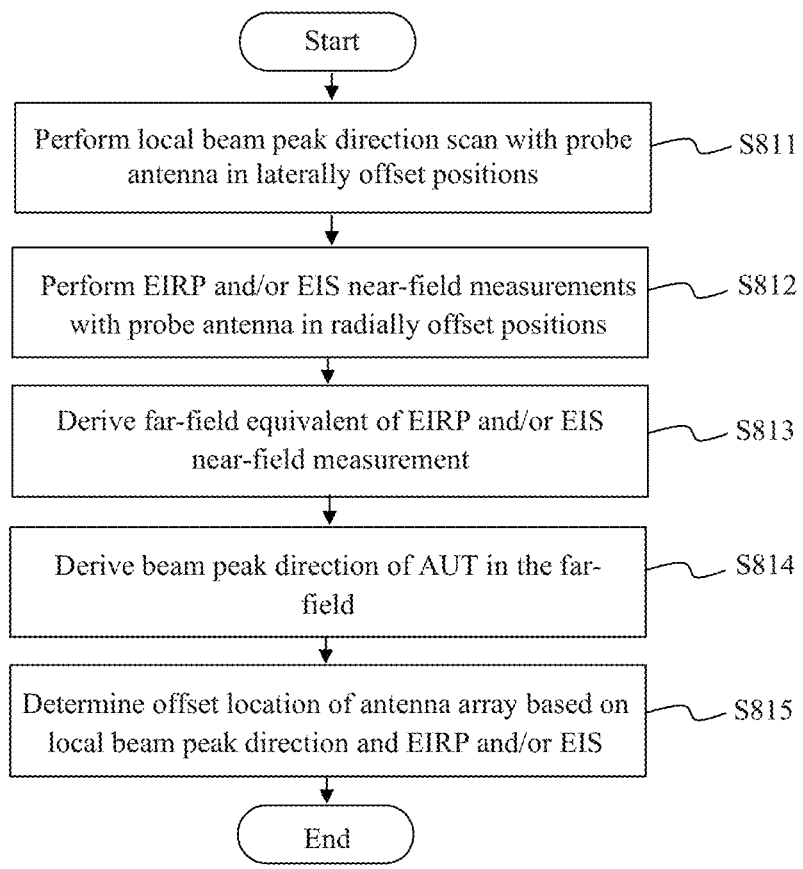
FIG. 8 is a flow diagram of a method of performing near-field measurements in a test chamber of EIRP and/or EIS of an AUT that is offset from a center of a quiet zone of the test chamber, according to a representative embodiment.

FIG. 8 is a flow diagram of a method of performing near-field measurements in a test chamber of EIRP and/or EIS of an AUT that is offset from a quiet zone center of the test chamber, according to a representative embodiment. Due to the unknown offset, the method of FIG. 8 involves black box testing. The method may be implemented by the processing unit 250, for example, where the method steps are provided as instructions stored in the memory 256 and executable by the processor device 255.

Referring to FIG. 8, as well as FIGS. 7A and 7B, a local beam peak direction scan is performed of an antenna pattern of the AUT 630 in block S811 to determine the beam peak direction BD in the near-field. As discussed above, the AUT 630 includes the antenna array 631 with the array phase center 635 offset from the quiet zone center 225 of the test chamber 205. The local beam peak direction scan is performed using the probe antenna 260 located at multiple laterally offset positions, such as the first, second and third lateral positions L1, L2 and L3, at the same fixed near-field distance from the AUT 630. EIRP and/or EIS near-field measurements are performed consecutively by the probe antenna 260 from each of the first, second and third lateral L1, L2 and L3. The beam peak direction BD of the AUT 630 may then be determined by comparing the EIRP and/or EIS near-field measurements to one another. The beam peak direction BD is identified in the direction corresponding to the one of the first, second and third lateral positions L1, L2 and L3 that has the greatest value of the EIRP and/or the smallest value of the EIS near-field measurements.

In block S812, EIRP and/or EIS near-field measurements of the AUT 630 are performed in the determined beam peak direction BD using the probe antenna 260 located at multiple near-field distances from the array phase center 635. The near-field distances are spaced apart from one another in a radial direction extending from the array phase center 635 in the beam peak direction BD determined in block S811. As discussed above, the probe antenna 260 is used to measure the EIRP and/or the EIS from at least three different distances from the array phase center 635, indicted by first, second and third radial positions R1, R2 and R3 in FIG. 7B, for example.

In block S813, the far-field equivalent of each of the EIRP and/or EIS near-field measurements is derived along the determined beam peak direction BD. In deriving the far-field equivalents of the EIRP and/or EIS near-field measurements, it is understood that the absolute values of the near-field distances are to be determined, and the intervals between adjacent ones of the near-field distances are known. That is, in the depicted example, the first, second and third near-field distances $d_1$, $d_2$ and $d_3$ (corresponding to the first, second and third radial positions R1, R2 and R3, respectively) are to be determined, and the first and second intervals $\Delta d_1$ and $\Delta d_2$ are known.

For example, referencing EIRP for purposes of illustration, deriving EIRP($d_f$) at the far-field distance $d_f$ from the EIRP near-field measurements of the AUT 630 involves solving for EIRP($d_f$) using Equations (1) and (2), identified above. For determining the radial offset of the array phase center 635, the value of the first near-field distance $d_1$ is determined. This is done by combining Equations (1) and (2) to provide Equation (3), as follows:

$$\text{EIRP}(d_f)=\text{EIRP}(d_1)+(-ad^{-1})|_{d_1}^{d_f}$$

$$\text{EIRP}(d_f)=\text{EIRP}(d_1)-ad_f^{-1}+ad_1^{-1} \quad (3)$$

Then, near-field measurements of the EIRP are performed at the second near-field distance $d_2$ and the third near-field distance $d_3$ to obtain the EIRP($d_2$) and the EIRP($d_3$), respectively. Since the first and second intervals $\Delta d_1$ and $\Delta d_2$ are known, the EIRP($d_f$) may be expressed as shown in Equations (4) and (5), derived from Equation (1):

$$\text{EIRP}(d_f)=\text{EIRP}(d_1+\Delta d_1)-ad_f^{-1}+a(d_1+\Delta d_1)^{-1} \quad (4)$$

$$\text{EIRP}(d_f)=\text{EIRP}(d_1+\Delta d_2)-ad_f^{-1}+a(d_1+\Delta d_2)^{-1} \quad (5)$$

There are three unknowns, including the first near-field distance $d_1$, the coefficient of expansion a, and the EIRP($d_f$). The values of these unknowns are derived by simultaneously solving Equations (3), (4) and (5). The EIS near-field measurements of the AUT 630 at the far-field distance $d_f$ may be derived using the same Equations (1)-(5), where EIS is substituted for EIRP. In Equations (4) and (5), EIRP($d_1+\Delta d_1$) is the same as EIRP($d_2$), and EIRP($d_1+\Delta d_2$) is the same as EIRP($d_3$).

In block S814, the beam peak direction of the AUT 630 in the far-field is derived based on the beam peak direction in the near-field. In particular, the beam peak direction of the AUT 630 in far-field is the same as the beam peak direction of the AUT 630 in near-field, which is determined in block S811. In the example depicted in FIG. 7A, the far-field beam peak direction is the direction starting from the array phase center 635 to the lateral position of L3.

In block S815, the offset location of the array phase center of the antenna array is determined based on the local beam peak direction scan and the EIRP near-field measurements and/or the EIS near-field measurements of the AUT in the determined beam peak direction using the probe antenna located at the near-field distances from the AUT in the radial direction. Determining the offset location of the array phase center 635 of the antenna array 631 includes determining a lateral offset and a radial offset of the array phase center 635. The lateral offset of the array phase center 635 is between the beam peak direction BD and a radial direction that parallels the beam peak direction BD extending from the quiet zone center 225. In FIG. 7A, the lateral offset is indicated by reference 633, which is equal to the lateral distance between the second and third lateral positions L2 and L3 of the probe antenna 260. The radial offset of the array phase center 635 is determined by fixing the lateral offset position of the probe antenna 260 to the lateral offset position in the beam peak direction BD of AUT 630, and performing the EIRP and/or EIS measurements at multiple near-field distances of the probe antenna 260 in a direction of the fixed lateral offset position, as discussed above with reference to block S813. The radial offset of the array phase center 635 may then be determined by subtracting the first near-field distance $d_1$ from the radius $r_1$ corresponding to the first radial position R1 the probe antenna 260, where the value of the first near-field distance $d_1$ is derived in block S814, above. The later offset and the radial offset together provide the offset OS of the array phase center 635.

Instead of a lateral offset search described above, the beam peak direction of the AUT antenna pattern may be searched according to a rotational peak search. Generally, the rotational peak search involves spherical rotation of the probe antenna(s) around the quiet zone center of the test chamber. A lateral translational positioner is not needed for the rotational peak search embodiments.

Figure 9:
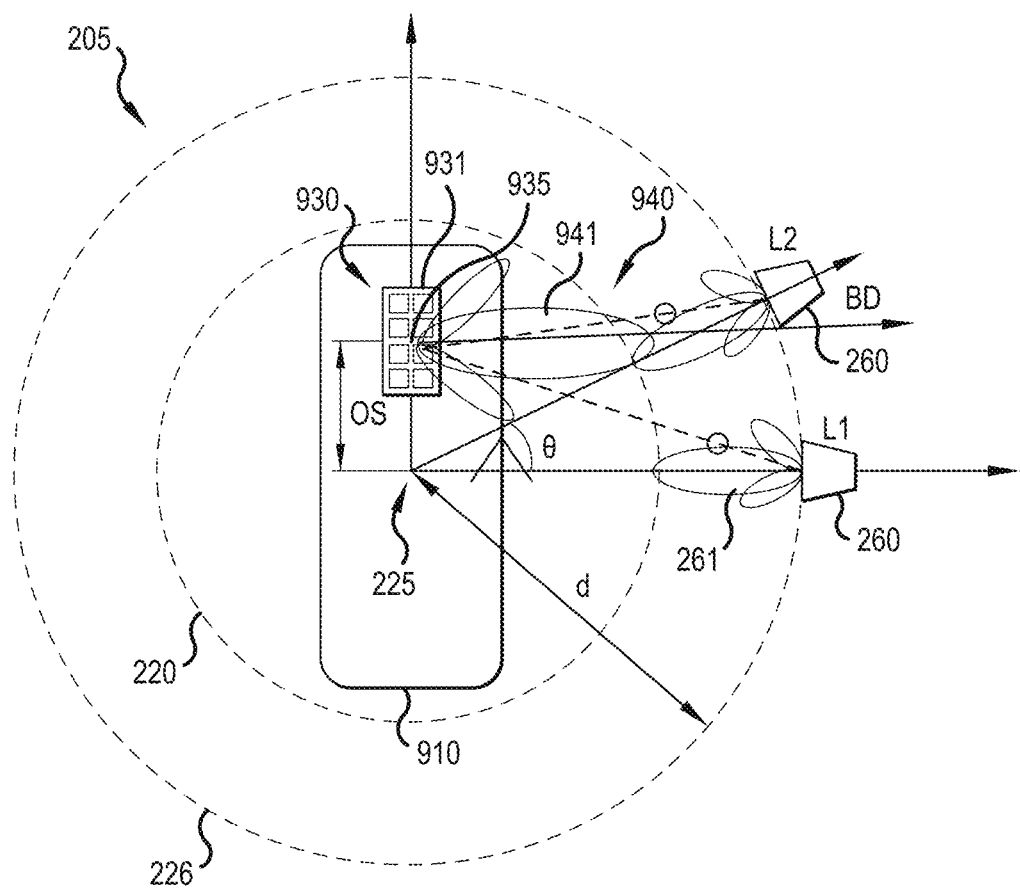
FIG. 9 is a schematic diagram of an AUT offset from a quiet zone center of a test chamber for measuring EIRP and/or EIS using rotational peak search, according to a representative embodiment.

FIG. 9 is a schematic diagram of an AUT offset from a quiet zone center of a test chamber for measuring EIRP and/or EIS using rotational peak search, according to a representative embodiment.

Referring to FIG. 9, DUT 910 is positioned in the quiet zone 220 of the test chamber 205. The DUT 910 includes AUT 930, which is offset from the quiet zone center 225 of the quiet zone 220. In the depicted embodiment, the AUT 930 includes an antenna array 931 with an array phase center 935. For purposes of illustration, and not limitation, the antenna array 931 includes eight antenna elements arranged in a 2×4 array, where the array phase center 935 is at the physical and electronic center of the 2×4 array. Of course, the antenna array 931 may include more or fewer antenna elements arranged in various patterns, without departing from the scope of the present teachings. The array phase center 935 of the antenna array 931 is offset from the quiet zone center 225 by an unknown offset distance, indicated by array offset OS, at a 90 degree angle from the quiet zone center 225. The AUT 930 has an antenna pattern 940 with multiple beams, including beam peak 941 in beam peak direction BD, indicated by an arrow extending from the array phase center 935 of the antenna array 931. The AUT 930 may be an uplink or downlink antenna.

The test chamber 205 further includes probe antenna 260, which is rotatable around the quiet zone center 225 in a measurement sphere 226. For purposes of illustration, the probe antenna 260 is shown in a first location L1 and a second location L2 at the same near-field distance or radius d from the quiet zone center 225. That is, the near-field distance d is the radius of the measurement sphere 226 centered at the quiet zone center 225. Alternatively, the probe antenna 260 may be rotated around other closed-surface geometric shapes, without departing from the scope of the present teachings. Also, in various embodiments, there may be multiple rotatable probe antennas at different locations, as opposed to one rotatable probe antenna 260. The probe antenna 260 has a corresponding probe antenna pattern (probe pattern) 261 generally directed toward the quiet zone center 225, as shown in FIG. 9.

The probe antenna 260 is positioned on the measurement sphere 226 rotation angle θ ("peak direction offset"). As shown, the rotation angle θ is the angle between a line extending from the quiet zone center 225 horizontally and a line extending from the quiet zone center 225 in to the corresponding location of the probe antenna 260. Thus, in the depicted example, when the probe antenna 260 is positioned on the measurement sphere 226 at location L1, the rotation angle θ is zero ("declared beam peak direction"), and when the probe antenna 260 is positioned on the measurement sphere 226 at location L2, the rotation angle θ is about 30 degrees ("measured beam peak direction").

When performing the rotational peak search for the beam peak 941 of the AUT 930, the array offset OS of the antenna array 931 and the probe pattern 261 of the probe antenna 260 cause distortion that impacts the measured antenna pattern of the AUT 930. This because the measured beam peak direction is different than the declared beam peak direction, as discussed above. Also, actual probe gain in a direction from the probe antenna 260 toward the array phase center 935 changes when the probe antenna 260 rotates around the quiet zone center 225, and the path loss between the probe antenna 260 and the array phase center 935 changes when the probe antenna 260 rotates around the quiet zone center 225. For example, the path loss is less when the probe antenna 260 is located at a 90 degree rotation angle θ than when the probe antenna 260 is located at 270 degree rotation angle θ, since the array phase center 935 of the antenna array 931 is closer to the probe antenna 260 located at the 90 degree rotation angle θ. According to embodiments herein, these distortion impacts are compensated for when performing a rotational peak search, so as to estimate the position of the antenna array 931 and the far-field EIRP and/or EIS, according to representative embodiments.

Figure 10A:
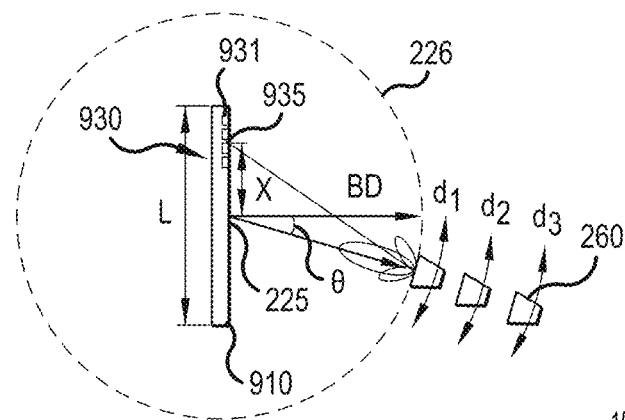
FIG. 10A is a schematic diagram of a DUT having an AUT offset from a quiet zone center of a test chamber for measuring EIRP and/or EIS at multiple near-field distances, according to a representative embodiment.
Figure 10B:
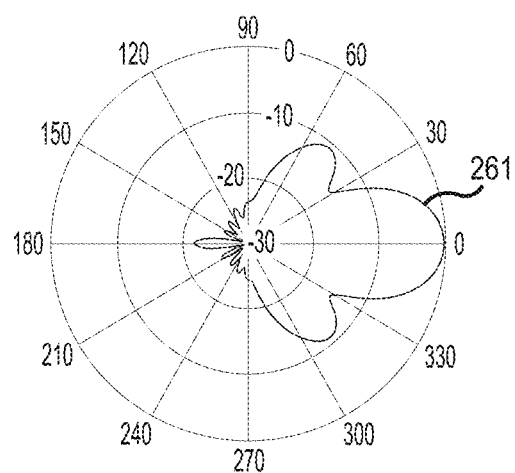
FIG. 10B is a polar radiation plot showing a probe antenna pattern of a probe antenna used for measuring the EIRP and/or EIS at the multiple near-field distances, according to a representative embodiment.
Figure 10C:
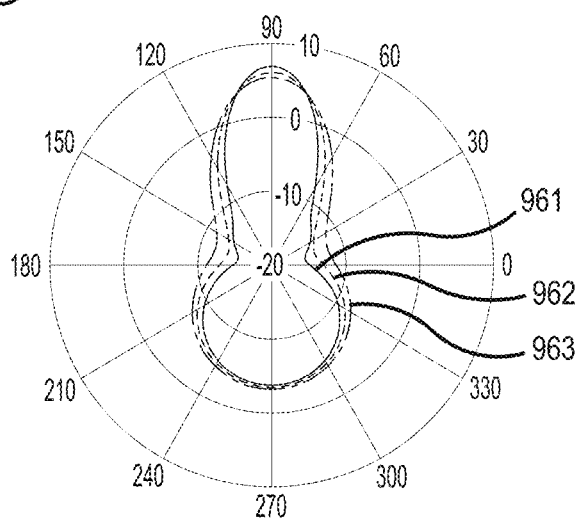

FIGS. 10A, 10B and 10C show a process for determining compensation curves for the probe antenna 260. In particular, FIG. 10A is a schematic diagram of an AUT offset from a quiet zone center of a test chamber for measuring EIRP and/or EIS at multiple near-field distances, according to a representative embodiment. FIG. 10B is a polar radiation plot showing a known probe antenna pattern of a probe antenna used for measuring the EIRP and/or EIS at the multiple near-field distances, and FIG. 10C is a polar radiation plot showing compensation curves corresponding to the multiple near-field distances, according to a representative embodiment.

Referring to FIG. 10A, the DUT 910 in the quiet zone (not shown in FIG. 10A) has length L, and the geometric center of the DUT 910 that is aligned with quiet zone center 225. The DUT 910 includes the AUT 930, including the antenna array 931 with the array phase center 935. The array phase center 935 is offset from the quiet zone center 225 by an assumed array offset x, as the actual array offset OS is initially unknown. The probe antenna 260 is shown in three illustrative locations at different radii (near-field measurement distances) $d_1$, $d_2$ and $d_3$, separated by known intervals, along the same radial (same rotation angle θ) extending from the quiet zone center 225. It is understood that the probe antenna 260 may be positioned at more locations, without departing from the scope of the present teachings. In the depicted example, the radial is at a rotation angle θ of about −20 degrees (340 degrees), for purposes of illustration. Also, for purposes of illustration, it is assumed that the assumed array offset x is only in one dimension, and is located somewhere along the lower or upper half the length L of the DUT 910, such that $x \in [-L/2, L/2]$.

FIG. 10B shows the known probe pattern 261, which is the same for the probe antenna 260 positioned at each of the radii $d_1$, $d_2$ and $d_3$ corresponding to different measurement spheres. As mentioned above, due to the presence of the actual array offset OS of the AUT 930, and the resulting differences in the probe gain and path loss for measurements by the probe antenna 260 at different locations around the measurement spheres, the antenna pattern 940 is adjusted in compensation to accurately estimate the position of the antenna array 931 and the far-field equivalents of the EIRP and/or EIS. Accordingly, compensation curves are determined from the probe pattern 261 using the probe antenna 260 located at the different radii $d_1$, $d_2$ and $d_3$, respectively. FIG. 10C shows illustrative first compensation curve 961 as determined with the probe antenna 260 at the first radius $d_1$, second compensation curve 962 as determined with the probe antenna 260 at the second radius $d_2$, and third compensation curve 963 as determined the probe antenna 260 at the third radius $d_3$. Each of the first, second and third compensation curves 961, 962 and 963 consists of two parts: compensation for actual probe gain and compensation for path loss from the respective positions of the probe antenna 260. The actual probe gain is determined by the included angle between a direction from the probe antenna 260 toward the array phase center 935 and a direction from probe antenna 260 to the center of quite zone center 225. The compensation for the actual probe gain is the difference between peak probe gain and the actual probe gain. The compensation for the path loss is proportional to the square of the distance between probe antenna 260 at the respective positions and the array phase center 935.

Figure 11A:
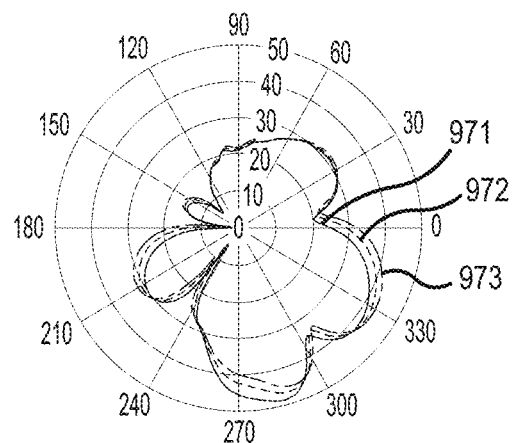
FIG. 11A is a polar radiation plot showing distorted antenna patterns (or beam patterns) of the AUT as measured by the probe antenna at the multiple near-field distances, according to a representative embodiment.
Figure 11B:
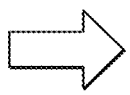
FIG. 11B is a polar radiation plot showing compensation curves corresponding to the multiple near-field distances shown in FIG. 10C, according to a representative embodiment.
Figure 11B:
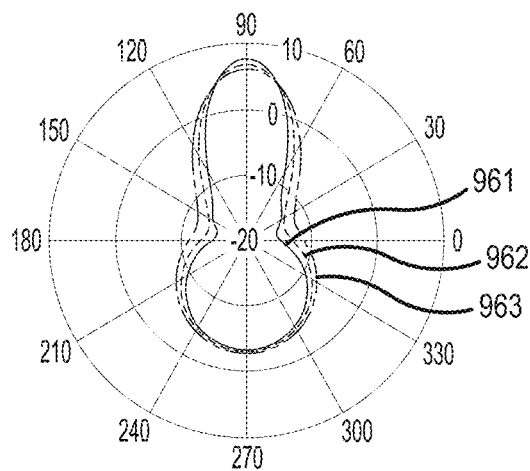
Figure 11C:
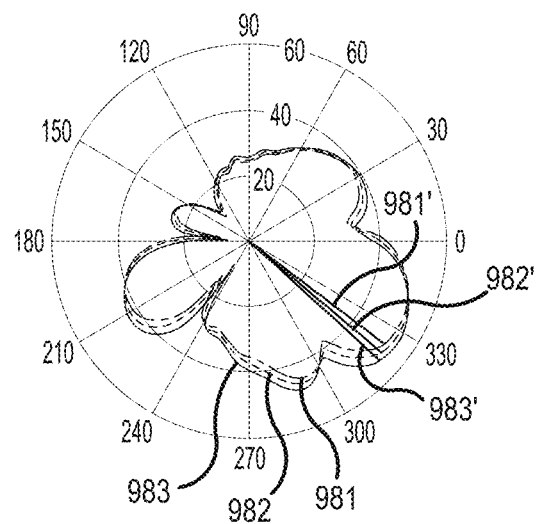
FIG. 11C is a polar radiation plot showing compensated (adjusted) antenna patterns of the AUT as seen from the multiple near-field distances, according to a representative embodiment.

FIGS. 11A, 11B and 11C show a process for combining the compensation curves with a distorted antenna pattern of the AUT as measured by the probe antenna to obtain compensated antenna patterns. In particular, FIG. 11A is a polar radiation plot showing distorted antenna patterns (or beam patterns) of the AUT as measured by the probe antenna at the multiple near-field distances, FIG. 11B is the polar radiation plot showing compensation curves corresponding to the multiple near-field distances shown in FIG. 10C, and FIG. 11C is a polar radiation plot showing compensated (adjusted) antenna patterns of the AUT as seen from the multiple near-field distances, according to a representative embodiment.

Referring to FIG. 11A, first distorted antenna pattern 971 of the AUT 930 was obtained with the probe antenna 260 at the first radius $d_1$, second distorted antenna pattern 972 was obtained with the probe antenna 260 at the second radius $d_2$, and third distorted antenna pattern 973 was obtained with the probe antenna 260 at the third radius $d_3$. As discussed above, the distortion results from the array offset OS of the array phase center 935 from the quiet zone center 225, and the gain from the probe pattern 261 shown in FIG. 10B and path loss during measurement by the probe antenna 260. The first, second and third distorted antenna patterns 971, 972 and 973 are respectively combined with the first, second and third compensation curves 961, 921 and 963 shown in FIG. 11B, thereby compensating for the distortion caused by differences in probe gain of the probe pattern 261 and path loss. For example, when the first, second and third distorted antenna patterns 971, 972 and 973 and the first, second and third compensation curves 961, 921 and 963 are in logarithm scale, they may be combined by adding together the corresponding pairs. The resulting combinations provide first compensated antenna pattern 981 of the AUT 930 corresponding to the probe antenna 260 at the first radius $d_1$, second compensated antenna pattern 982 corresponding to the probe antenna 260 at the second radius $d_2$, and third compensated antenna pattern 983 corresponding to the probe antenna 260 at the third radius $d_3$, as shown in FIG. 11C. For each of the first, second and third compensated antenna patterns 981, 982 and 983, a beam peak direction from the array phase center 935 is derived, resulting in corresponding compensated beam peak directions 981', 982' and 983', respectively. The beam peak directions 981', 982' and 983' are derived from the first, second and third compensated antenna patterns 981, 982 and 983 by searching the beam peaks in the first, second and third compensated antenna patterns 981, 982 and 983, respectively. The direction of the beam peak will be the true beam peak direction.

Figure 12:
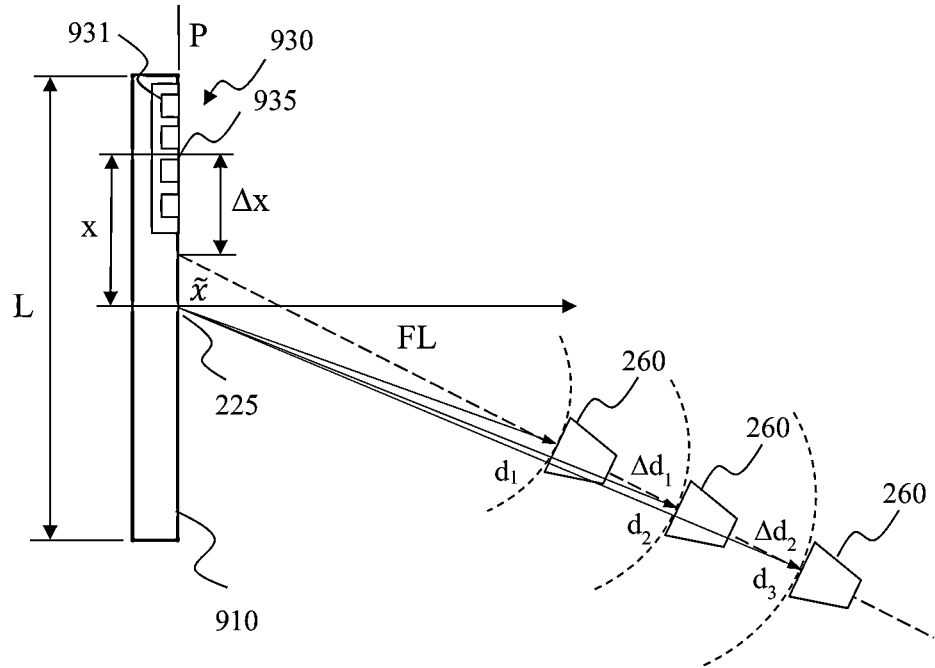
FIG. 12 is a schematic diagram of the AUT and a probe antenna at multiple locations for determining an actual array offset of the AUT from the quiet zone center, according to a representative embodiment.

FIG. 12 is a schematic diagram of the AUT and a probe antenna at multiple locations for determining an actual array offset of the AUT from the quiet zone center, according to a representative embodiment.

Referring to FIG. 12, the DUT 910 has its geometric center aligned with quiet zone center 225. The DUT 910 includes the AUT 930 having the antenna array 931 with the array phase center 935 offset from the quiet zone center 225. The amount of the array offset is initially indicated by an assumed array offset x. The assumed array offset x may be an arbitrary value in the range of $-L/2$ to $L/2$.

The probe antenna 260 is shown in three illustrative locations at different radii (near-field measurement distances) $d_1$, $d_2$ and $d_3$ along the same radial extending from the quiet zone center 225, as discussed above. The compensated beam peak directions 981', 982' and 983' for the first, second and third compensated antenna patterns 981, 982 and 983 from FIG. 11C are used to derive an estimated array offset $\tilde{x}$ corresponding to that radial. For example, the estimated array offset $\tilde{x}$ may be determined by performing a linear fitting on beam peaks in the compensated antenna patterns 981, 982 and 983 as determined using the probe antenna 260 at the radii $d_1$, $d_2$ and $d_3$, respectively. The linear fitting provides a fitting line FL passing through the beam peak positions of the first, second and third compensated antenna patterns 981, 982 and 983. The fitting line FL intersects a plane P of the AUT 930 at fitting line intersection, which corresponds to the estimated array offset $\tilde{x}$. An offset error $\Delta x$ is calculated between the initially assumed array offset x and the estimated array offset $\tilde{x}$, where $\Delta x = \tilde{x} - x$.

The second radius $d_2$ equals the first radius $d_1$ plus a known first interval $\Delta d_1$, and the third radius $d_3$ equals the second radius $d_2$ plus a known second interval $\Delta d_2$. The first and second intervals $\Delta d_1$ and $\Delta d_2$ may be the same as or different from one another. The estimated array offset $\tilde{x}$ may be determined, for example, by performing a linear fitting on the compensated beam peaks, and identifying the estimated array offset $\tilde{x}$ where the fitting line intersects the plane P of the DUT 910. The corresponding offset error $\Delta x$ is calculated for each assumed array offset x by determining the difference between the assumed array offset x and the estimated array offset $\tilde{x}$.

This process is repeated for multiple assumed array offsets x, where $x \in [-L/2, L/2]$. That is, for each assumed array offset x, the probe antenna 260 is positioned at different radii $d_1$, $d_2$ and $d_3$ along a radial corresponding to the beam peak positions of the compensated antenna patterns, respectively, an estimated array offset $\tilde{x}$ is determined, and a corresponding offset error $\Delta x$ is identified as the difference between the assumed array offset x and the estimated array offset $\tilde{x}$. The actual array offset OS (in FIG. 9) may then be determined by identifying the offset error $\Delta x$ corresponding to the assumed array offset x that has the smallest absolute value. For example, the smallest absolute offset error $\Delta x$ may be identified using a grid search of the assumed array offsets x and the corresponding offset errors $\Delta x$, where the actual array offset OS is at the zero-crossing point (ZCP) of the offset error $\Delta x$ curve with respect to the assumed array offsets x. Thus, the minimum offset error $\Delta x$ is selected to identify the actual array offset OS of the array phase center.

Figure 13:
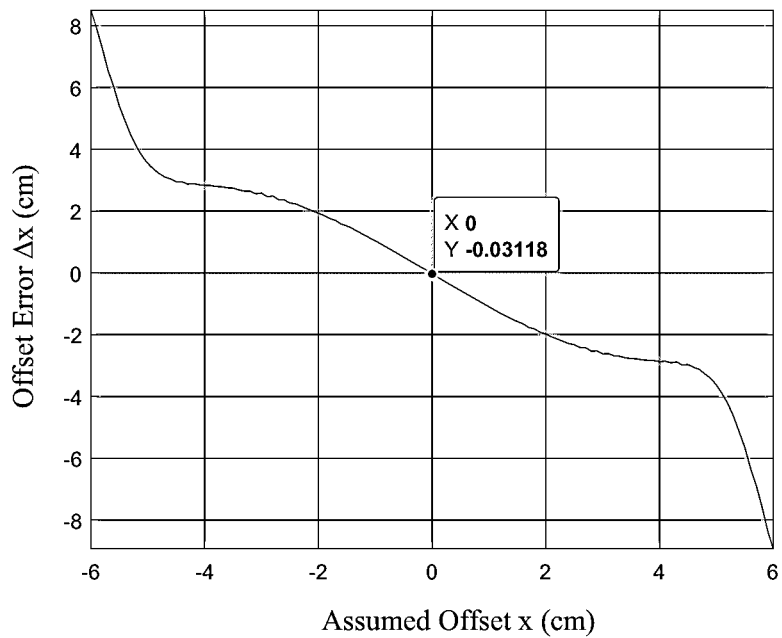
FIG. 13 is a graph showing the ZCP of the offset error $\Delta x$ versus assumed array offset x for determining actual array offset, according to a representative embodiment.

FIG. 13 is a graph showing the ZCP of the offset error $\Delta x$ versus assumed array offset x for determining actual array offset, according to a representative embodiment. As shown, the actual array offset OS is the value of the assumed array offset x at the ZCP. Instead of doing grid search for each assumed array offset x, an iterative search approach may be used to determine the ZCP from the offset error $\Delta x$ curve, e.g., in FIG. 13, to identify the actual array offset OS. In addition to determining the actual array offset OS, this technique may be extended to support estimating an array offset in any position (x,y,z) in the quiet zone 220.

Near-field to far-field correction may be performed based on the compensated antenna patterns at the multiple radii $d_1$, $d_2$ and $d_3$. Based on the determined actual array offset OS, the EIRP and/or EIS may be measured at multiple near-field distances from the AUT 930 in a compensated beam peak direction. These near-field EIRP and/or EIS measurements may be made in the same radial directions and radii used for determining the actual array offset OS, although not necessarily. The far-field EIRP and/or EIS may be derived using the same method discussed above with regard to Equations (1)-(5). That is, three unknowns, including a first near-field distance (first radius) $d_1$, a coefficient of expansion a, and an EIRP($d_f$) (or EIS($d_f$)) are derived by simultaneously solving Equations (3), (4) and (5), where Equations (3), (4) and (5) are derived from Equations (1) and (2).

Figure 14:
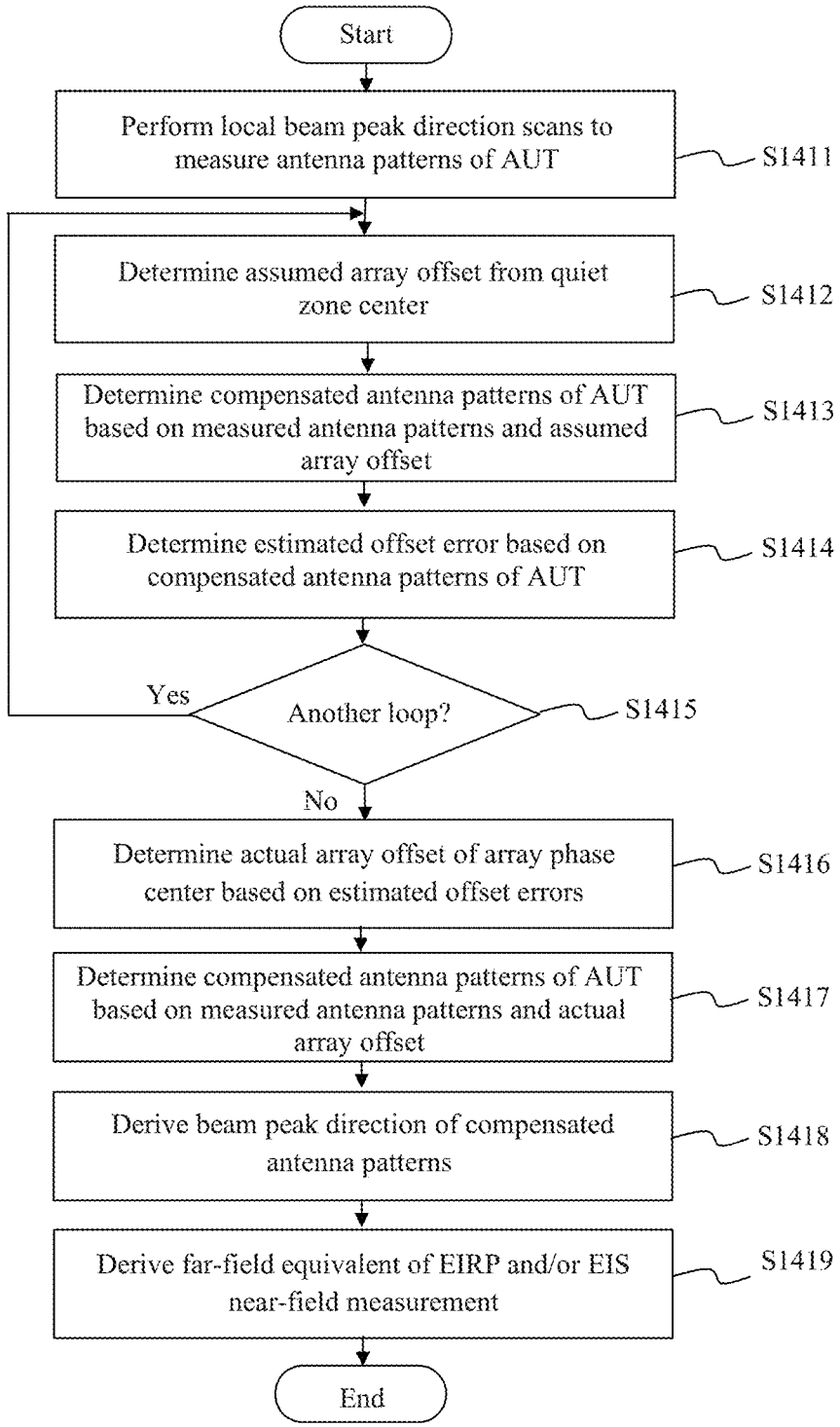
FIG. 14 is a flow diagram of a method of determining EIRP and/or EIS of an AUT in a test chamber, the AUT being offset from a center of a quiet zone of the test chamber, using a rotational peak search, according to a representative embodiment.

FIG. 14 is a flow diagram of a method of determining EIRP and/or EIS of an AUT in a test chamber, the AUT being offset from a center of a quiet zone of the test chamber, using a rotational peak search, according to a representative embodiment. Since the offset distance is not known, the method of FIG. 14 involves black box testing. The method may be implemented by the processing unit 250, for example, where the method steps are provided as instructions stored in the memory 256 and executable by the processor device 255.

Referring to FIG. 14, as well as FIG. 9, local beam peak direction scans are performed in block S1411 to measure antenna patterns of the AUT 930 using probe antenna 260 in order to determine near-field beam peak directions of the AUT 930. The antenna patterns may be measured, for example, by performing the EIRP and/or EIS measurements at a first near-field distance (radius $d_1$) in different directions to get a measured pattern of the AUT 930 for the first near-field distance. Then, EIRP and/or EIS measurements are performed at a second near-field distance (radius $d_2$) in different directions from the quiet zone center 225 to get a measured pattern of the AUT 930 for the second near-field distance, and EIRP and/or EIS measurements are performed at a third near-field distance (radius $d_3$) in different directions to get a measured pattern of the AUT 930 for the third near-field distance. That is, the local beam peak direction scans include sequentially positioning the probe antenna 260 on test points in a sector of a measurement sphere at the different near-field distances from the quiet zone center 225. The sector within which the measurements are made may be determined based on the length L of the DUT 910 and/or the radii $d_1$, $d_2$ and $d_3$, or by performing a whole spherical scan, for example. In an embodiment, the local beam peak direction scans are performed with the probe antenna 260 on three different radii (e.g., radii $d_1$, $d_2$ and $d_3$) separated by known intervals from the quiet zone center 225. Near-field beam peak directions of the AUT 930 may be determined based on the measured antenna patterns at the near-field distances.

Following block S1411, multiple loops are performed to identify the actual array offset of the array phase center 935 of the AUT 930 from the quiet zone center 225. Each loop begins with block S1412, in which an assumed array offset (x) is determined. The assumed array offset is an arbitrary distance between the array phase center 935 and the quiet zone center 225 in the plane of the DUT 910 within the range of [−L/2, L/2].

In block S1413, compensated antenna patterns of the AUT 930 are determined for the measured antenna patterns from block S1411, respectively. As discussed above, the measured antenna patterns are distorted because of the array phase center 935 being offset from the quiet zone center 225. The compensated antenna patterns are therefore determined by determining compensation curves for the probe pattern of the probe antenna 260 at the different near-field distances corresponding to the distorted antenna patterns, and combining the compensation curves and the distorted antenna patterns to obtain the compensated antenna patterns. The compensation curves may be determined by compensating for actual probe gain and path loss from the respective different near-field distances of the probe antenna 260, where the compensation for the actual probe gain is the difference between peak probe gain and the actual probe gain, and compensation for the path loss is proportional to the square of the distance between the probe antenna 260 at each of the different near-field distances and the array phase center 935.

In block S1414, an estimated offset error is determined based on the compensated antenna patterns of the AUT 930. For example, an estimated array offset ($\tilde{x}$) may be determined by performing a linear fitting on beam peaks in the compensated antenna patterns of the AUT 930 to provide a fitting line, and identifying an intersection of the fitting line and a plane of DUT 910 as the estimated array offset ($\tilde{x}$). The difference between the assumed array offset (x) and the estimated array offset ($\tilde{x}$) is determined to provide an offset error ($\Delta x$).

In block S1415, it is determined whether additional loops are to be performed. Generally, the more loops that are performed, the greater the accuracy of the determination of the actual array offset OS, discussed below. The number of loops that are to be performed may be predetermined by the user, for example. When it is determined that at least one additional loop is to be performed (block S1415: Yes), the process returns to block S1412, where a different assumed array offset (x) is determined. When it is determined that no additional loops are to be performed (block S1415: No), the process proceeds to block S1416.

In block S1416, the actual array offset OS of array phase center 935 is determined based on the offset errors corresponding to the different assumed array offsets (x) and estimated array offsets ($\tilde{x}$) from the loops. For example, the actual array offset OS may be determined to be the estimated offset error corresponding to the smallest absolute offset error ($\Delta x$). Therefore, a minimum absolute offset error ($\Delta x$) in all the loops of the loop procedure is determined based on comparing the offset errors, and the loop that corresponds to the minimum absolute offset error ($\Delta x$) is selected as to determine the actual array offset OS for the offset location of the array phase center 935.

In block S1417, compensated antenna patterns of the AUT 930 are determined based on the measured antenna patterns (from block S1411) and the actual array offset OS, as described above. For example, differences in the probe gain of the probe antenna 260 and the path loss resulting from the probe antenna 260 at the three near-field distances are compensated for by calculating compensation curves for the probe gain and path loss based on the actual offset OS of the array phase center 935, and combining the compensation curves with the measured antenna patterns to obtain the compensated antenna patterns of the AUT 930.

In an embodiment, compensating for the probe gain and path loss differences based on the determined actual offset OS of the array center of the antenna array may include calculating compensation curves for the probe gain and path loss based on the actual offset location of the array phase center 935, and combining the compensation curves with the measured antenna patterns to obtain compensated antenna patterns of the AUT 930. The compensated antenna patterns account for the changes in the probe gain and path loss of the probe antenna, due to the actual array offset OS of the AUT 930, as the probe antenna 260 is rotated around the measurement sphere at different radii for measuring the near-field EIRP and/or EIS.

In block S1418, a beam peak direction corresponding to each of the compensated antenna patterns is derived from the compensated antenna pattern. Deriving each beam peak direction includes searching the corresponding compensated antenna pattern, using EIRP and/or EIS measurements, for example. The derived beam peak directions may be referred to as the true beam peak directions.

In block S1419, the far-field equivalents of the EIRP and/or EIS measurements from block S1411 are derived in the beam peak directions. The far-field EIRP and/or EIS measurements may be derived using the same method discussed above with regard to Equations (1)-(5). That is, three unknowns, including a first radii $d_1$, a coefficient of expansion a, and an $EIRP(d_f)$ (or $EIS(d_f)$) are derived by simultaneously solving Equations (3), (4) and (5), where Equations (3), (4) and (5) are derived from Equations (1) and (2), as discussed above.

In an embodiment, for each loop of the loop procedure in FIG. 14, distortion caused by the probe gain and the path loss variations for each near-field location of the probe antenna may be compensated for based on the corresponding assumed array offset. In this case, the method of determining EIRP and/or EIS of the AUT 930 using the rotational peak search may further include determining an included angle between the probe antenna 260 to the array phase center 935 of the antenna array 931 and a bore of sight of the probe antenna 260 (angle 0 of the probe pattern 261 in FIG. 10B); determining an actual probe gain of the probe antenna 260 to the array phase center 935, where an opposite number of the actual probe gain is used as a compensation curve for compensating the probe antenna pattern; and determining a distance between probe antenna 260 and the array phase center 935. A ratio of the determined distance to a radius of the probe antenna 260 to the center of quiet zone 220 is calculated, and the ratio is used to compensate for the distortion caused by the path loss variation.

In an alternative embodiment, the location of the AUT on the DUT is known, and therefore the actual array offset of the AUT from the quiet zone center of the test chamber is also known. For example, the offset of the AUT from a geometric center of the DUT may be provided by the manufacturer or determined prior to the EIRP and/or EIS testing. So, when the geometric center of the DUT is aligned with the quiet zone center in the test chamber, the array offset is easily determined since it will be the same as the known offset of the AUT from the geometric center of the DUT. Knowing the array offset avoids having to perform local beam peak direction scans to measure the AUT antenna pattern using a probe antenna at different locations in order to determine the array offset.

Determining the EIRP and/or the EIS of the AUT with the known offset therefore may be referred to as gray box testing. That is, the known offset of the AUT from the geometric center of the DUT (and thus the known array offset of the AUT from the quiet zone center during testing) is an aspect of white box testing, while determining a compensated antenna pattern of the AUT to derive a beam peak direction of the AUT and far-field equivalents of the EIRP and/or the EIS is done pursuant to black box testing.

Figure 15:
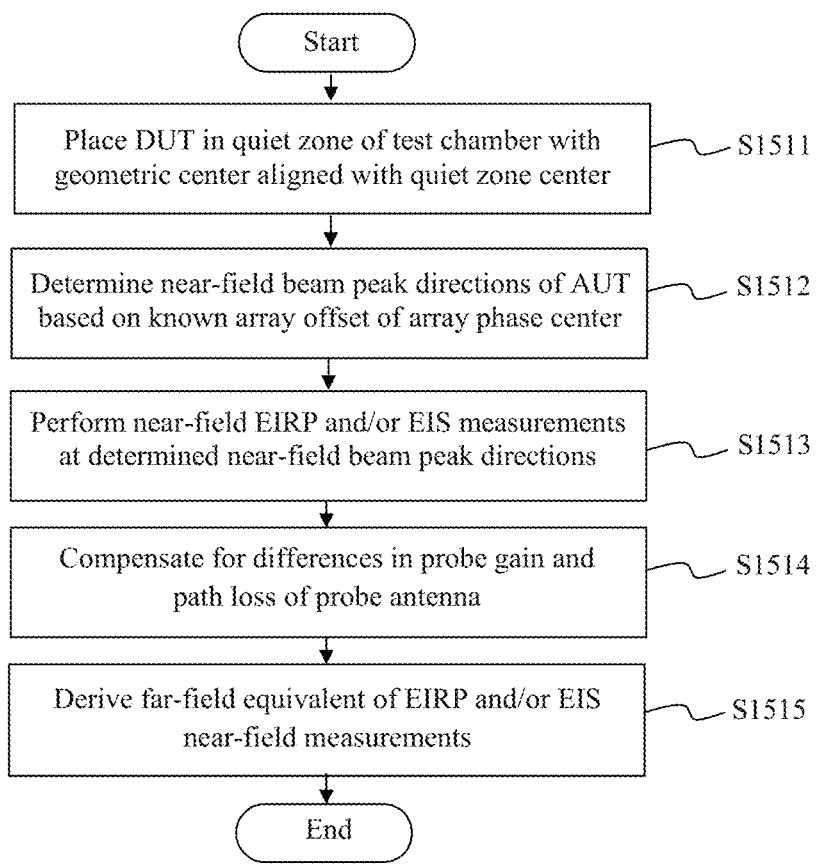
FIG. 15 is a flow diagram of a method of determining EIRP and/or EIS of an AUT in a test chamber, the AUT being offset from a center of a quiet zone of the test chamber by a known amount, using a rotational peak search, according to a representative embodiment.

FIG. 15 is a flow diagram of a method of determining EIRP and/or EIS of an AUT in a test chamber, the AUT being offset from a center of a quiet zone of the test chamber by a known amount, using a rotational peak search, according to a representative embodiment. The method may be implemented by the processing unit 250, for example, where the method steps are provided as instructions stored in the memory 256 and executable by the processor device 255.

Figure 16:
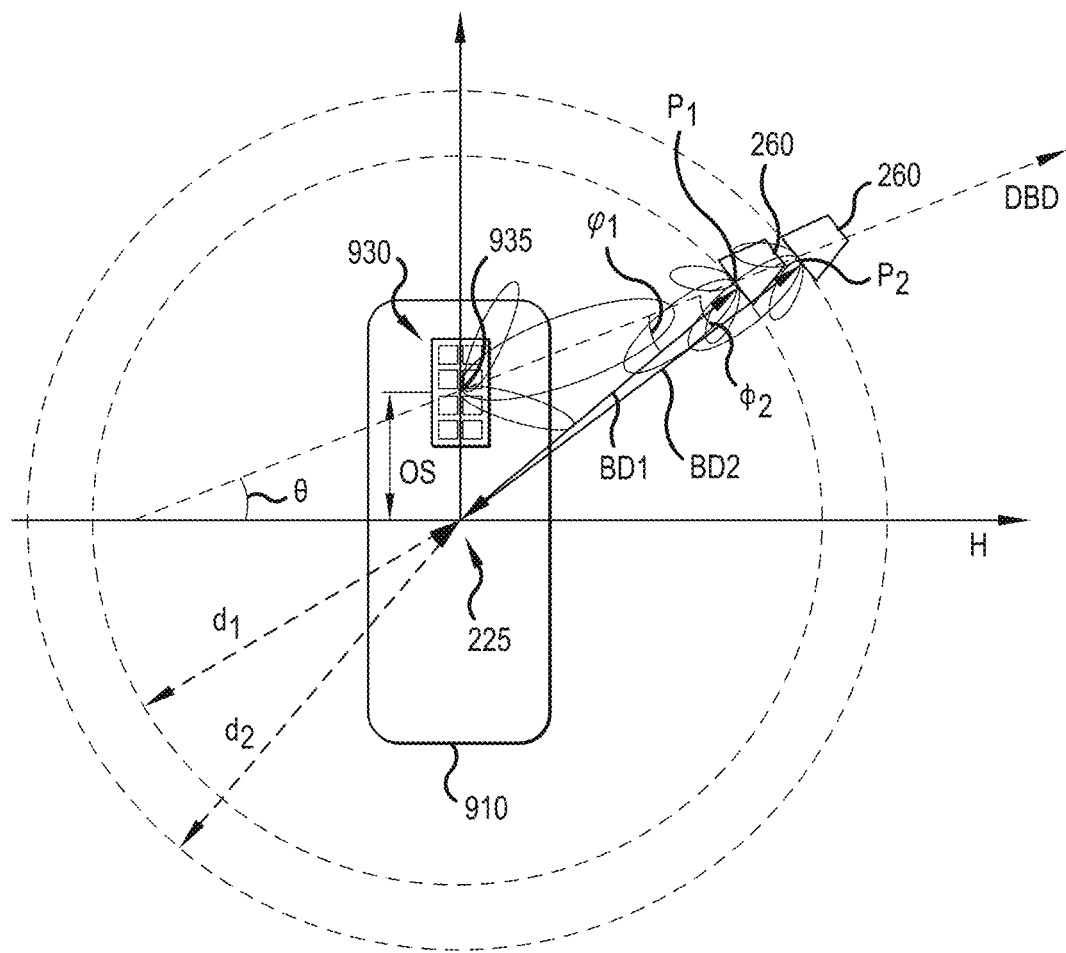
FIG. 16 is a schematic diagram of an AUT offset from a quiet zone center of a test chamber by a known amount for measuring EIRP and/or EIS using a rotational peak search, according to a representative embodiment.

FIG. 16 is a schematic diagram of an AUT offset from a quiet zone center of a test chamber by a known amount for measuring EIRP and/or EIS using a rotational peak search, according to a representative embodiment.

Referring to FIG. 15, as well as FIG. 9, the DUT 910 is placed in a quiet zone of the test chamber 205 in block S1511, such that a geometric center of the DUT 910 aligns with a quiet zone center 225 of the quiet zone 220. The AUT 930 includes the antenna array 931 with the array phase center 935 offset from the geometric center of the DUT by a known offset, including a known distance and angle (radial) from the geometric center. Since the geometric center of the DUT 910 is aligned with the quiet zone center 225, the known offset of the array phase center 935 from the geometric center is the same as the actual offset OS shown in FIG. 9. The known offset may have been determined in any number of ways. For example, the known offset may be provided in specifications of the DUT 910, e.g., obtained from the manufacturer. Or, the known offset may be measured prior to placing the DUT 910 in the test chamber 205 using the array offset estimation discussed above with reference to blocks S1411 to S1416.

In block S1512, a near-field beam peak directions of the AUT 930 are determined based on the known array offset OS of the array phase center 935 from the quiet zone center 225. Referring to FIG. 16, the array offset OS is known. First radius $d_1$ and second radius $d_2$ are also known, where the first radius $d_1$ is between the quiet zone center 225 and the probe antenna 260 at a first near-field distance, and the second radius $d_2$ is between the quiet zone center 225 and the probe antenna 260 at a second near-field distance further out than the first near field distance. The declared beam peak direction in the far-field, indicated by arrow DBD, is the direction extending from a horizontal axis H including the quiet zone center 225, through the array phase center 935 and the probe antenna 260. A first near-field beam peak direction BD1 is determined in the direction from the quiet zone center 225 to the probe antenna 260 at the first radius $d_1$, and a second near-field beam peak direction BD2 is determined in the direction from the quiet zone center 225 to the probe antenna 260 at the second radius $d_2$, as shown.

In particular, the first and second near-field beam peak directions BD1 and BD2 are derived from the known array offset OS, the first and second radii $d_1$ and $d_2$, and the declared beam peak direction DBD. Therefore, the probe antenna 260 can be positioned in the direction in which maximum EIRP and/or EIS may be measured in the near-field without having to perform a search. That is, the AUT 930 transmits in the true beam peak direction. $P_1$ is the position of the probe antenna 260 in the declared beam direction DBD at the first radius $d_1$, $P_2$ is the position of the probe antenna 260 in the declared beam direction DBD at the second radius $d_2$, and θ is the angle of the declared peak direction DBD from the horizontal axis H. As shown, angle $\varphi_1 = \operatorname{asin}(^{\sin(\theta+90) \cdot OS/d_1})$ and angle $\varphi_2 = \operatorname{asin}(^{\sin(\theta+90) \cdot OS/d_2})$, where OS is the antenna array offset (distance between the quite zone center 225 and the array phase center 935). So, the included angle between the offset OS and a line connecting the quite zone center 225 and the position $P_1$ can be determined as $180-(\theta+90)-\varphi_1$, and the included angle between the offset OS and a line connecting the quite zone center 225 and the position $P_2$ can be determined as $180-(\theta+90)-\varphi_2$. Accordingly, the true first near-field beam peak direction BD1 can be determined as $90-(180-(\theta+90)-\varphi_1) = \theta+\varphi_1$, and the true second near-field beam peak direction BD2 can be determined as $90-(180-(\theta+90)-\varphi_2) = \theta+\varphi_2$.

In block S1513, near-field EIRP and/or EIS are measured in the determined near-field beam peak directions of the AUT 930 determined in block S1512. The near-field EIRP and/or EIS are measured by the probe antenna 260, for example, at each of the first radius $d_1$ and the second radius $d_2$.

In block S1514, differences in the probe gain of the probe pattern and the path loss of the probe antenna 260, resulting from the probe antenna 260 rotating around the measurement sphere, are compensated for based on the determined actual offset OS of array phase center 935 of the antenna array 931. In an embodiment, compensating for the probe gain and path loss differences based on the offset location of array phase center of the antenna array may include calculating compensation values for the probe gain and path loss based on the actual offset OS of the array phase center 935 in the near-field beam peak directions BD1 and BD2 for each of the first radius $d_1$ and the second radius $d_2$, and combining the compensation values with the measured antenna patterns, measured in block S1513, to obtain compensated antenna patterns of the AUT 930, as discussed above. The compensated antenna patterns account for the changes in the probe gain and path loss of the probe antenna, due to the array offset of the AUT 930, as the probe antenna is rotated around the measurement sphere for measuring the near-field EIRP and/or EIS.

Far-field equivalents of the EIRP and/or EIS measurements are derived in block S1515 in the declared beam peak direction DBD, which is the far-field equivalent beam peak direction. The far-field EIRP and/or EIS measurements may be derived using the same method discussed above with regard to Equations (1)-(4). That is, two unknowns, including a coefficient of expansion a, and an EIRP($d_f$) (or EIS($d_f$)) are derived by simultaneously solving Equations (3) and (4), where Equations (3) and (4) are derived from Equations (1) and (2). Only two equations are needed since there are only two unknowns.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those having ordinary skill in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to an advantage.

Aspects of the present invention may be embodied as an apparatus, method or computer program product. Accordingly, aspects of the present invention may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

The invention claimed is:

1. A method of determining at least one of equivalent isotropic radiated power (EIRP) or effective isotropic sensitivity (EIS) of an antenna under test (AUT) in a test chamber, the AUT including an antenna array with an array phase center that is offset from a center of a quiet zone of the test chamber, the method comprising:

performing a local beam peak direction scan of an antenna pattern of the AUT using a probe antenna located at a plurality of laterally offset positions at a fixed near-field distance from the AUT to determine a beam peak direction of the AUT, wherein the probe antenna has a known probe antenna pattern;

performing EIRP near-field measurements and/or EIS near-field measurements of the AUT in the determined beam peak direction using the probe antenna located at a plurality of near-field distances from the AUT in a radial direction;

deriving a far-field equivalent of the EIRP near-field measurements and/or the EIS near-field measurements of the AUT along the determined beam peak direction; and deriving the beam peak direction of the AUT.

2. The method of claim 1, further comprising:

determining an offset location of the array phase center of the antenna array based on the local beam peak direction scan and the EIRP near-field measurements and/or the EIS near-field measurements of the AUT in the determined beam peak direction using the probe antenna located at the plurality of near-field distances from the AUT in the radial direction.

3. The method of claim 2, wherein determining the offset location of the array phase center of the antenna array comprises:

determining a lateral offset of the array phase center between the determined beam peak direction and the radial direction, wherein the lateral offset is the lateral offset position of the probe antenna at the beam peak direction of AUT; and determining a radial offset of the array phase center by fixing the lateral offset position of the probe antenna to the lateral offset position at the beam peak direction of AUT, and performing EIRP measurements at a plurality of near-field distances of the probe antenna in a direction of the fixed lateral offset position, wherein absolute values of the near-field distances are to be determined, and intervals between adjacent ones of the near-field distances are known.

4. The method of claim 3, wherein deriving the EIRP near-field of the AUT at a far-field distance ($d_f$) comprises solving for EIRP($d_f$) as follows:

$$EIRP(d_f) = EIRP(d_1) + \int_{d_1}^{d_f} \frac{\partial p}{\partial d} d\Delta d \quad \text{Equation (1)}$$

wherein EIRP($d_1$) is measured EIRP at a first near-field distance ($d_1$) of the plurality of near-field distances, d is the plurality of near-field distances, $d\Delta d$ is differentiation of the distances d, and $$\frac{\partial p}{\partial d}$$

is a derivation of power to distance, determined as follows:

$$\frac{\partial p}{\partial d} = ad^{-2} + \Delta(d) \quad \text{Equation (2)}$$

wherein a is a coefficient of expansion to be determined, and $\Delta(d)$ is redundant term of $$\frac{\partial p}{\partial d}$$

which consist of terms lower order than $d^{-2}$, wherein $\Delta(d)$ is ignored.

5. The method of claim 4, wherein a first near-field distance of the plurality of near-field distances of the probe antenna for determining the radial offset of the array phase center is equal to $d_1$, and wherein a value of $d_1$ is determined by:
combining Equation (1) and Equation (2) to provide:

$$EIRP(df)=EIRP(d_1)-ad_f^{-1}+ad_1^{-1} \quad \text{Equation (3)}$$

wherein a and $d_1$ are unknown parameters;
performing measurements of the EIRP at a second near-field distance ($d_2$) and a third near-field distance ($d_3$) to obtain measured EIRP($d_2$) and measured EIRP($d_3$), wherein the second near-field distance ($d_2$) equals the first near-field distance ($d_1$) plus a known first interval ($\Delta d_1$), and the third near-field distance ($d_3$) equals the second near-field distance ($d_2$) plus a known second interval ($\Delta d_2$), wherein the EIRP($d_f$) is also expressed as:

$$EIRP(d_f)=EIRP(d_1+\Delta d_1)-ad_f^{-1}+a(d_1+\Delta d_1)^{-1} \quad \text{Equation (4)}$$

$$EIRP(d_f)=EIRP(d_1+\Delta d_2)-ad_f^{-1}+a(d_1+\Delta d_2)^{-1} \quad \text{Equation (5)}$$

solving Equations (3), (4) and (5) to derive unknown parameters a and $d_1$, as well as the EIRP($d_f$).

6. The method of claim 3, wherein deriving the EIS near-field of the AUT at a far-field distance ($d_f$) comprises solving for EIS ($d_f$) as follows:

$$EIS(d_f) = EIS(d_1) + \int_{d_1}^{d_f} \frac{\partial p}{\partial d} d\Delta d \quad \text{Equation (1)}$$

wherein EIS($d_1$) is measured EIS at a first near-field distance ($d_1$) of the plurality of near-field distances, d is the plurality of near-field distances, $d\Delta d$ is differentiation of the distances d, and $$\frac{\partial p}{\partial d}$$

is a derivation of power to distance, determined as follows:

$$\frac{\partial p}{\partial d} = ad^{-2} + \Delta(d) \quad \text{Equation (2)}$$

wherein a is a coefficient of expansion to be determined, and $\Delta(d)$ is redundant term of $$\frac{\partial p}{\partial d}$$

which consist of terms lower order than $d^{-2}$, wherein $\Delta(d)$ is ignored.

7. The method of claim 6, wherein a first near-field distance of the plurality of near-field distances of the probe antenna for determining the radial offset of the array phase center is equal to $d_1$, and wherein a value of $d_1$ is determined by:
combining Equation (1) and Equation (2) to provide:

$$EIS(df)=EIS(d_1)-ad_f^{-1}+ad_1^{-1} \quad \text{Equation (3)}$$

wherein a and $d_1$ are unknown parameters;
performing measurements of the EIS at a second near-field distance ($d_2$) and a third near-field distance ($d_3$) to obtain measured EIS ($d_2$) and measured EIS($d_3$), wherein the second near-field distance ($d_2$) equals the first near-field distance ($d_1$) plus a known first interval ($\Delta d_1$), and the third near-field distance ($d_3$) equals the second near-field distance ($d_2$) plus a known second interval ($\Delta d_2$), wherein the ES ($d_f$) is also expressed as:

$$EIS(d_f)=EIS(d_1+\Delta d_1)-ad_f^{-1}+a(d_1+\Delta d_1)^{-1} \quad \text{Equation (4)}$$

$$EIS(d_f)=EIS(d_1+\Delta d_2)-ad_f^{-1}+a(d_1+\Delta d_2)^{-1} \quad \text{Equation (5)}$$

solving Equations (3), (4) and (5) to derive unknown parameters a and $d_1$, as well as the EIRP($d_f$).

8. A method of determining at least one of equivalent isotropic radiated power (EIRP) or effective isotropic sensitivity (EIS) of an antenna under test (AUT) in a test chamber, the AUT including an antenna array with an array phase center that is offset from a center of a quiet zone of the test chamber, the method comprising:
performing local beam peak direction scans to measure antenna patterns of the AUT using a probe antenna positioned at a plurality of near-field radii from the center of the quiet zone, wherein the probe antenna has a known probe antenna pattern;
determining an actual offset of the array phase center of the antenna array based on the measured antenna patterns in the local beam peak direction scans;
compensating the measured antenna patterns for probe gain and path loss difference of the probe antenna positioned at the plurality of near-field radii to provide compensated antenna patterns of the AUT;
deriving beam peak directions of the AUT from the compensated antenna patterns; and deriving a far-field equivalent of the at least one of the EIRP or the EIS of the AUT in the derived beam peak directions.

9. The method of claim 8, wherein determining the actual offset of the array phase center of the antenna array comprises:
performing a loop procedure, wherein for each loop of the loop procedure:
assume an array offset at an offset location to be one of possible array offsets;
compensate the measured antenna patterns for probe gain and path loss difference of the probe antenna positioned at the plurality of near-field radii to provide compensated antenna patterns of the AUT based on the assumed array offset;
determine an estimated array offset based on the compensated antenna patterns; and
compare the assumed array offset and the estimated array offset to get an estimation deviation;
determining a minimum estimation deviation in all loops of the loop procedure based on the estimation deviations; and
selecting the assumed array offset of the loop corresponding to the minimum estimation deviation to be the actual array offset for the offset location of the array phase center.

10. The method of claim 9, wherein for each loop of the loop procedure, compensating for the measured antenna patterns for probe gain and path loss difference comprises:
determining an included angle between the probe antenna to the array phase center of the antenna array and a bore of sight of the probe antenna;
determining an actual probe gain to the array phase center of the antenna array, wherein an opposite number of the actual probe gain is used as a compensation curve for compensating the probe antenna pattern;
determining a distance between probe antenna and the array phase center of the antenna array;
calculating a ratio of the determined distance to a radius length of the probe antenna to the center of quiet zone; and
using the ratio to compensate for distortion caused by path loss variation.

11. The method of claim 9, wherein determining the estimated array offset comprises:
performing linear fitting on multiple beam peaks on each of the plurality of near-field radii; and
identifying an intersection of a fitting line from the linear fitting and a plane of AUT as the estimated array offset of the center of the antenna array.

12. The method of claim 8, wherein compensating the measured antenna patterns for the probe gain and the path loss difference comprises:
calculating compensation curves for a probe antenna pattern and path loss based on the determined actual offset of the array phase center; and
combining the compensation curves with the measured antenna patterns to obtain compensated antenna patterns of AUT.

13. The method of claim 12, wherein deriving the beam peak directions of AUT comprises:
performing linear fitting on an offset location of array phase center and beam peaks of the compensated antenna patterns of the AUT.

14. The method of claim 8, wherein deriving the EIRP of the AUT at a far-field distance ($d_f$) comprises solving for EIRP($d_f$) as follows:

$$EIRP(d_f) = EIRP(d_1) + \int_{d_1}^{d_f} \frac{\partial p}{\partial d} d\Delta d \quad \text{Equation (1)}$$

wherein EIRP($d_1$) is measured EIRP at a first near-field distance ($d_1$) of a plurality of near-field distances, d is the plurality of near-field distances, d∆d is differentiation of the distance distances d, and $$\frac{\partial p}{\partial d}$$

is a derivation of power to distance, determined as follows:

$$\frac{\partial p}{\partial d} = ad^{-2} + \Delta(d) \quad \text{Equation (2)}$$

wherein a is a coefficient of expansion to be determined, and ∆(d) is redundant term of $$\frac{\partial p}{\partial d}$$

which consist of terms lower order than $d^{-2}$, wherein ∆(d) is ignored.

15. The method of claim 14, wherein a first near-field distance of the plurality of near-field distances of the probe antenna for determining the actual offset of the array phase center is equal to $d_1$, and wherein a value of $d_1$ is determined by:
combining Equation (1) and Equation (2) to provide:

$$EIRP(df)=EIRP(d_1)-ad_f^{-1}+ad_1^{-1} \quad \text{Equation (3)}$$

wherein a and $d_1$ are unknown parameters;
performing measurements of the EIRP at a second near-field distance ($d_2$) and a third near-field distance ($d_3$) to obtain measured EIRP($d_2$) and measured EIRP($d_3$), wherein the second near-field distance ($d_2$) equals the first near-field distance ($d_1$) plus a known first interval (∆$d_1$), and the third near-field distance ($d_3$) equals the second near-field distance ($d_2$) plus a known second interval (∆$d_2$), wherein the EIRP($d_f$) is also expressed as:

$$EIRP(d_f)=EIRP(d_1+\Delta d_1)-ad_f^{-1}+a(d_1+\Delta d_1)^{-1} \quad \text{Equation (4)}$$

$$EIRP(d_f)=EIRP(d_1+\Delta d_2)-ad_f^{-1}+a(d_1+\Delta d_2)^{-1} \quad \text{Equation (5)}$$

solving Equations (3), (4) and (5) to derive unknown parameters a and $d_1$, as well as the EIRP($d_f$).

16. The method of claim 8, wherein deriving the EIRP of the AUT at a far-field distance ($d_f$) comprises solving for EIS($d_f$) as follows:

$$EIS(d_f) = EIS(d_1) + \int_{d_1}^{d_f} \frac{\partial p}{\partial d} d\Delta d \quad \text{Equation (1)}$$

wherein EIS ($d_1$) is measured EIS at a first near-field distance ($d_1$) of a plurality of near-field distances, d is the plurality of near-field distances, dΔd is differentiation of the distance distances d, and $$\frac{\partial p}{\partial d}$$

is a derivation of power to distance, determined as follows:

$$\frac{\partial p}{\partial d} = ad^{-2} + \Delta(d) \qquad \text{Equation (2)}$$

wherein a is a coefficient of expansion to be determined, and Δ(d) is redundant term of $$\frac{\partial p}{\partial d}$$

which consist of terms lower order than $d^{-2}$, wherein Δ(d) is ignored.

17. The method of claim 16, wherein a first near-field distance of the plurality of near-field distances of the probe antenna for determining the actual offset of the array phase center is equal to $d_1$, and wherein a value of $d_1$ is determined by:
  combining Equation (1) and Equation (2) to provide:

$$EIS(df) = EIS(d_1) - ad_f^{-1} + ad_1^{-1} \qquad \text{Equation (3)}$$

wherein a and $d_1$ are unknown parameters;
  performing measurements of the EIS at a second near-field distance ($d_2$) and a third near-field distance ($d_3$) to obtain measured EIS ($d_2$) and measured EIS ($d_3$), wherein the second near-field distance ($d_2$) equals the first near-field distance ($d_1$) plus a known first interval ($\Delta d_1$), and the third near-field distance ($d_3$) equals the second near-field distance ($d_2$) plus a known second interval ($\Delta d_2$), wherein the EIS ($d_f$) is also expressed as:

$$EISP(d_f) = EIS(d_1 + \Delta d_1) - ad_f^{-1} + a(d_1 + \Delta d_1)^{-1} \qquad \text{Equation (4)}$$

$$EIS(d_f) = EIS(d_1 + \Delta d_2) - ad_f^{-1} + a(d_1 + \Delta d_2)^{-1} \qquad \text{Equation (5)}$$

solving Equations (3), (4) and (5) to derive unknown parameters a and $d_1$, as well as the EIS ($d_f$).

18. A method of determining at least one of equivalent isotropic radiated power (EIRP) or effective isotropic sensitivity (EIS) of an antenna under test (AUT) of a device under test (DUT), the method comprising:
  placing the DUT in a quiet zone of a test chamber such that a geometric center of the DUT aligns with a quiet zone center of the quiet zone, wherein the AUT comprises an antenna array with an array phase center that is offset from the geometric center of the DUT by a known offset distance;
  determining near-field beam peak directions of the AUT toward a probe antenna on a plurality of near-field radii based on the known offset distance of the array phase center from the geometric center of the DUT, the plurality of near-field radii, and a declared beam peak direction of the AUT;
  performing measurements of antenna patterns of the AUT using the probe antenna on the plurality of near-field radii extending from the quiet zone center in the near-field beam peak directions;
  compensating the measured antenna patterns of the AUT for probe gain of the probe antenna and path loss difference based on the known offset distance of array phase center of the antenna array to provide compensated antenna patterns of the AUT; and
  deriving a far-field equivalent of the at least one of the EIRP or the EIS of the AUT in the declared beam peak direction of the AUT.

* * * * *